US006870123B2

(12) United States Patent
Suzuki et al.

(10) Patent No.: US 6,870,123 B2
(45) Date of Patent: Mar. 22, 2005

(54) MICROWAVE APPLICATOR, PLASMA PROCESSING APPARATUS HAVING SAME, AND PLASMA PROCESSING METHOD

(75) Inventors: Nobumasa Suzuki, Tochigi (JP); Shigenobu Yokoshima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 639 days.

(21) Appl. No.: 09/816,359

(22) Filed: Mar. 26, 2001

(65) Prior Publication Data

US 2001/0054605 A1 Dec. 27, 2001

Related U.S. Application Data

(63) Continuation-in-part of application No. 09/426,744, filed on Oct. 26, 1999, now abandoned.

(30) Foreign Application Priority Data

| Oct. 29, 1998 | (JP) | ............................................. 10-308836 |
| Jul. 5, 1999 | (JP) | ............................................. 11-190400 |
| Mar. 29, 2000 | (JP) | ......................................... 2000-091709 |

(51) Int. Cl.⁷ ............................................... B23K 10/00

(52) U.S. Cl. .............................. 219/121.43; 219/121.4; 219/691; 118/723 MW; 204/298.38; 156/345.41

(58) Field of Search ......................... 219/121.36, 121.4, 219/121.41, 121.43, 121.44, 121.59, 691; 118/723 MW, 723 R; 204/298.37, 298.38; 156/345.36, 345.41

(56) References Cited

U.S. PATENT DOCUMENTS

| 3,127,609 A | 3/1964 | Wentworth .................. 343/708 |
| 3,577,207 A | 5/1971 | Kirjushin ...................... 315/39 |
| 5,024,716 A | 6/1991 | Sato ............................ 156/345 |
| 5,034,086 A | 7/1991 | Sato ............................ 156/345 |
| 5,134,965 A | 8/1992 | Tokuda et al. ............... 118/723 |
| 5,359,177 A | 10/1994 | Taki et al. ............. 219/121.43 |
| 5,478,459 A | 12/1995 | Latz ....................... 204/298.19 |
| 5,517,085 A | 5/1996 | Engemann et al. ..... 315/111.21 |
| 5,538,699 A | 7/1996 | Suzuki .................. 422/186.29 |
| 5,803,975 A | 9/1998 | Suzuki ............... 118/723 MW |

FOREIGN PATENT DOCUMENTS

| EP | 0 564 359 A1 | 1/1993 |
| EP | 0 564 359 | 10/1993 |
| JP | 3-19332 | 1/1991 |
| JP | 5-290995 | 11/1993 |
| JP | 5-345982 | 12/1993 |
| JP | 7-90591 | 4/1995 |
| JP | 7-142193 | 6/1995 |
| JP | 10-275696 | 10/1998 |

*Primary Examiner*—Mark Paschall
(74) *Attorney, Agent, or Firm*—Fitzpatrick, Cella, Harper & Scinto

(57) ABSTRACT

In order to more accurately control the radiation characteristics of microwaves to improve the controllability of processing in radial and circumferential directions of an article, there are disclosed a microwave applicator and a plasma processing apparatus using the applicator, which comprise a circular waveguide having a surface provided with a plurality of slots for radiating microwaves, wherein the centers of the plurality of slots are offset in a direction parallel to the surface with respect to the center of the circular waveguide.

23 Claims, 16 Drawing Sheets

MICROWAVE APPLICATOR, PLASMA PROCESSING APPARATUS HAVING SAME, AND PLASMA PROCESSING METHOD

This application is a continuation-in-part of prior application Ser. No. 09/426,744 filed Oct. 26, 1999, now abandoned, the contents of which are incorporated by reference.

BACKGROUND OF THE INVENTION

1. Field of the Invention

The present invention relates to a plasma processing apparatus for applying plasma processing to an article to be processed (hereinafter, simply referred to as "article" as occasion demands) using microwaves, and more particularly to a microwave applicator having a circular (or annular) waveguide, a plasma processing apparatus provided therewith, and a plasma processing method.

2. Related Background Art

As plasma processing apparatuses that use microwaves as an excitation source for plasma excitation, there have been known the plasma polymerizing apparatus, the CVD apparatus, the surface modifying apparatus, the etching apparatus, the ashing apparatus, and the cleaning apparatus and the like.

The CVD using such a so-called microwave plasma processing apparatus is carried out, for example, as follows. A gas is introduced into a plasma generation chamber and/or a film formation chamber of a microwave plasma CVD apparatus, and a microwave energy is simultaneously applied to generate a plasma in the plasma generation chamber to form ions or radicals through excitation, decomposition, ionization, or the like of the gas, thereby forming a deposited film on an article disposed in the plasma generation chamber or the film formation chamber apart from the plasma generation chamber. Further, a similar method can be used to carry out plasma polymerization or surface modification such as oxidation, nitridation or fluorination of an organic substance.

Furthermore, the etching of an article using a so-called microwave plasma etching apparatus is carried out, for example, as follows. An etchant gas is introduced into a processing chamber of the apparatus, and a microwave energy is simultaneously applied to generate a plasma in the processing chamber to thereby form ions, radicals or the like through excitation, decomposition, or ionization of the etchant gas, thereby etching a surface of an article disposed in the processing chamber with the thus formed ions, radicals or the like.

In addition, the ashing of an article using a so-called microwave plasma ashing apparatus is carried out, for example, as follows. An ashing gas is introduced into a processing chamber in the apparatus, and a microwave energy is simultaneously applied to generate a plasma in the processing chamber to thereby form ions, radicals, ozone or the like through excitation, decomposition, or ionization of the ashing gas, thereby ashing a surface of an article, namely a photoresist disposed in the processing chamber. As with the ashing, it is possible to effect cleaning for removing unwanted matter deposited on a to-be-processed surface of an article.

In the microwave plasma processing apparatus, since microwaves are used as a gas excitation source, electrons can be accelerated by an electric field having a high frequency, thereby efficiently ionizing or exciting gas molecules. Thus, the microwave plasma processing apparatus is advantageous in that the efficiency of ionization, excitation, and decomposition of a gas is high, so that a high density plasma can relatively easily be formed, and that it is possible to carry out fast, high quality processing at a low temperature. In addition, there is a further advantage that the microwaves have a property of penetrating a dielectric member such as quartz glass, so that the plasma processing apparatus can be constituted as a electrodeless discharge type, whereby highly clean plasma processing can be carried out.

To increase the processing speed of such a microwave plasma processing apparatus, plasma processing apparatuses utilizing electron cyclotron resonance (ECR) have been put to practical use. The ECR is a phenomenon in which when the magnetic flux density is 87.5 mT, the electron cyclotron frequency for electrons rotating around the magnetic line of force is brought into conformity with the general frequency of the microwaves of 2.45 GHz, whereby the electrons resonantly absorb microwaves to be accelerated, thereby generating a high density plasma.

Further, there have been proposed other types of plasma processing apparatuses for generating a high density plasma.

For example, U.S. Pat. No. 5,034,086 discloses a plasma processing apparatus using a radial line slot antenna (RLSA).

In addition, Japanese Patent Application Laid-Open No. 5-290995, U.S. Pat. No. 5,359,177, and EP 0564359 disclose plasma processing apparatuses using a circular waveguide with terminals.

Separately, as an example of a microwave plasma processing apparatus, there has recently been proposed an apparatus using an endless circular waveguide in which a plurality of slots are formed on an inner side surface thereof as a device for uniform and efficient introduction of microwaves (Japanese Patent Application Laid-Open No. 5-345982; U.S. Pat. No. 5,538,699).

However, when the conventional microwave plasma processing apparatus provided with an endless circular waveguide having slots on an inner side surface thereof is used to effect processing in a high pressure region at 100 mTorr (about 13.3 Pa) or more, as in the case of the ashing processing, the diffusion of plasma is suppressed, so that the plasma may locally exist in the periphery of the chamber to reduce the processing speed for the center portion of the article. In addition, the volume of the plasma generation space is required to be very large.

Further, Japanese Patent Application Laid-Open No. 7-90591 discloses a plasma processing apparatus using a disc-like microwave introducing device. In this apparatus, a gas is introduced into a waveguide and emitted to a plasma generation chamber through slots provided in the waveguide.

Compared with these conventional apparatuses, the plasma processing apparatus previously proposed by the present inventors has a configuration as shown in FIG. 12.

In FIG. 12, reference numeral 1 designates a container (or vessel) which can be evacuated; 2 is a holding means for holding an article to be processed; 3 is a microwave supply means (also referred to as "microwave applicator") comprising a circular hollow waveguide having a circular waveguide therein; 4 is a dielectric window; and 7 is a gas supply pipe having gas supply ports 7a. In the apparatus configured using these components, microwaves are introduced into the microwave applicator 3 through a microwave introducing port 15 and supplied from slots 3b through the dielectric window 4 into the container 1.

FIGS. 13, 14 and 15 are schematic views illustrating the propagation of microwaves through the circular waveguide of the microwave applicator and the radiation of microwaves through the slots.

FIG. 13 shows the circular waveguide as seen from above with the slots omitted, FIG. 14 shows a cross section taken along line 14—14, and FIG. 15 shows a cross section taken along line 15—15.

The vicinity of the microwave introducing port 15 forms an equivalent circuit of E-plane T-junction (or T-distribution), and microwaves introduced through the microwave introducing port 15 have their course changed so as to fork clockwise $d_2$ and counterclockwise $d_1$. Each slot 3b is provided so as to intersect the microwave traveling directions $d_1$ and $d_2$ so that the microwaves travel while being emitted through the slots.

Since the circular waveguide has no terminals and is endless, the microwaves propagating in the directions $d_1$ and $d_2$ (z-axis direction) interfere mutually. Reference numeral C1 denotes an annulus (ring) formed by connecting widthwise centers of the waveguide, and the standing waves of a predetermined mode can be generated more easily by setting the length of this ring, that is, the circumferential length at an integral multiple of the guide wavelength (wavelength in waveguide).

FIG. 14 shows a cross section perpendicular to the microwave traveling direction (z-axis direction). In this figure, the upper and bottom surfaces 3c of the waveguide form H-planes perpendicular to the direction of electric field EF, while the right and left surfaces 3d of the waveguide form E-planes parallel to the direction of the electric field EF. Reference numeral C0 denotes the center of the longitudinal direction of the slot 3b, that is, the direction (x-axis direction) perpendicular to the microwave traveling/propagating direction.

Thus, the cross section of the waveguide that is perpendicular to the microwave traveling direction has a rectangular shape having the x- and the y-axes as the longer and the shorter sides, respectively.

Microwaves MW introduced into the circular waveguide 3a are distributed by the distributor 10 of E-plane T-junction to the right and left of the drawing and propagate at a guide wavelength longer than the wavelength in the free space. The distributed microwaves interfere with each other at their opposing portion to form standing waves at every ½ of the guide wavelength. Leakage waves EW radiated through the dielectric window 4 from the slots 3b provided at such positions as to maximize the electric field crossing the slots generate a plasma P1 near the slots 3b. When the electron frequency of the generated plasma P1 exceeds the frequency of the microwave power source (for example, when the electron density exceeds $7 \times 10^{10}$ cm$^{-3}$ at the power source frequency of 2.45 GHz), the so-called cut-off in which microwaves can not propagate through the plasma is caused, so that they propagate through the interface between the dielectric window 4 and the plasma as surface waves SW. Surface waves SW introduced via adjacent slots interfere with each other to form antinodes (loops) of electric field at every ½ of the wavelength ($\lambda \in_r^{-1/2}$ wherein $\lambda$ is microwave wavelength in free space, and $\in_r$ is dielectric constant) of the surface waves SW. The antinodes of electric field resulting from the interference of the surface waves leaked to the plasma generation space side generate a surface-wave interfered plasma (SIP) P2. At this time, when a processing gas is introduced into the plasma processing chamber, the processing gas is excited, decomposed, or ionized by the thus generated high density plasma to enable processing of a surface of an article.

The use of such a microwave plasma processing apparatus can generate a high density, low potential plasma of a uniformity within ±3%, an electron density $10^{12}$/cm$^3$ or more, an electron temperature 3 eV or less, and a plasma potential 20 V or less in a space with an aperture of a diameter of 300 mm or more at a pressure of about 1.33 Pa and a microwave power of 1 kW or more.

Thus, the gas can fully be reacted and supplied in an active state to a surface to be processed. Furthermore, when the pressure is 2.7 Pa and the microwave power is 2 kW, any current due to the microwaves cannot be detected at a location apart by 8–10 mm away from the inner surface of the dielectric window. This means that a very thin plasma layer is formed near the dielectric window in a high pressure region where plasma diffusion is suppressed. Thus, article surface damage due to incident ions can be reduced, thereby enabling high quality and high speed processing even at low temperatures.

Incidentally, the circumferential length of the circular waveguide must be selected from 2 times, 3 times, 4 times, . . . the guide wavelength (i.e., integral multiple of the guide wavelength) depending the processing area of an article. When air exists at atmospheric pressure in the waveguide, considering that the guide wavelength is about 159 mm, selectable circumferential length is about 318 mm, about 477 mm, about 636 mm, . . . Converting these values to the diameter of the ring provides about 101 mm, about 151 mm, about 202 mm.

On the other hand, when an ordinary 8-inch or 12-inch wafer is used as an article to be processed, the diameters thereof are about 200 mm and about 300 mm, respectively. Even when an optimum combination of the both members, it can not be said that uniformity of plasma and uniformity of processing are attained sufficiently. For example, there is caused a phenomenon in which the plasma density is lowered near the center of the ring or near the center of the article, so that the processing speed is decreased.

SUMMARY OF THE INVENTION

An object of the present invention is to provide a microwave applicator that can more accurately control the microwave radiation characteristics in radial direction of the ring or a direction equivalent thereto.

Another object of the present invention is to provide a plasma processing apparatus and method that can more efficiently improve the uniformity of processing in a radial direction of an article.

Still another object of the present invention is to provide a microwave applicator that can improve the microwave radiation uniformity in radial and circumferential directions of the ring or a direction equivalent thereto.

Yet another object of the present invention is to provide a plasma processing apparatus and method that can wholly improve the uniformity of processing in radial and circumferential directions or a direction equivalent thereto of an article.

According to an aspect of the present invention, there is provided a microwave applicator or a plasma processing apparatus comprising a circular waveguide having a surface provided with a plurality of slots for radiating microwaves, wherein the centers of the plurality of slots are offset in a direction parallel to the surface with respect to the center of the circular waveguide.

According to another aspect of the present invention, there is provided a microwave applicator or a plasma processing apparatus comprising a circular waveguide having a flat surface provided with a plurality of slots for radiating microwaves, wherein the plurality of slots are discontinuous linear slots provided in a direction intersecting the microwave travelling direction.

According to still another aspect of the present invention, there is provided a plasma processing apparatus comprising a container, a gas supply port for supplying a processing gas into the container, and a microwave applicator for supplying microwaves into the container through a dielectric window, the microwave applicator comprising an endless circular waveguide having a plurality of slots provided at a predetermined interval in a plane thereof in contact with the dielectric window, wherein the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$, is the number of antinodes of surface standing waves generated between the slots, $\lambda_s$. is the wavelength of surface waves, $n_g$ is the ratio of the circumferential length $l_g$ of the circular waveguide to the guide wavelength $\lambda_g$.

According to yet another aspect of the present invention, there is provided a plasma processing method comprising the steps of placing an article in a container with a microwave transmissive dielectric window; evacuating the container; introducing a processing gas into the container; and supplying microwaves into the container through an endless circular waveguide having a plurality of slots provided by perforation at a predetermined interval in a plane thereof in contact with the dielectric window and configured such that the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$ is the number of antinodes of surface standing waves generated between the slots, $\lambda_s$ is the wavelength of surface waves, $n_g$ is the ratio of the circumferential length $l_g$ of the circular waveguide to the guide wavelength $\lambda_g$, thereby generating a plasma in the container.

According to still a further aspect of the present invention, there is provided a plasma processing apparatus comprising an internally evacuatable container and a gas supply port for supplying a processing gas into the container, for plasma processing an article arranged in the container, further comprising means for supplying a microwave energy for generating a plasma of the gas in the container, the means comprising an endless circular waveguide having a plurality of slots provided at a predetermined interval in a plane on the dielectric window side thereof, wherein the centers of the plurality of slots are offset in a direction parallel to the plane with respect to the center of the circular waveguide such that the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$ is the number of antinodes of surface standing waves generated between the slots, $\lambda_s$ is the wavelength of surface waves, $n_g$ is the ratio of the circumferential length $l_g$ of the circular waveguide to the guide wavelength $\lambda_g$.

DETAILED DESCRIPTION OF THE PREFERRED EMBODIMENTS (Embodiment 1)

Figure 1:
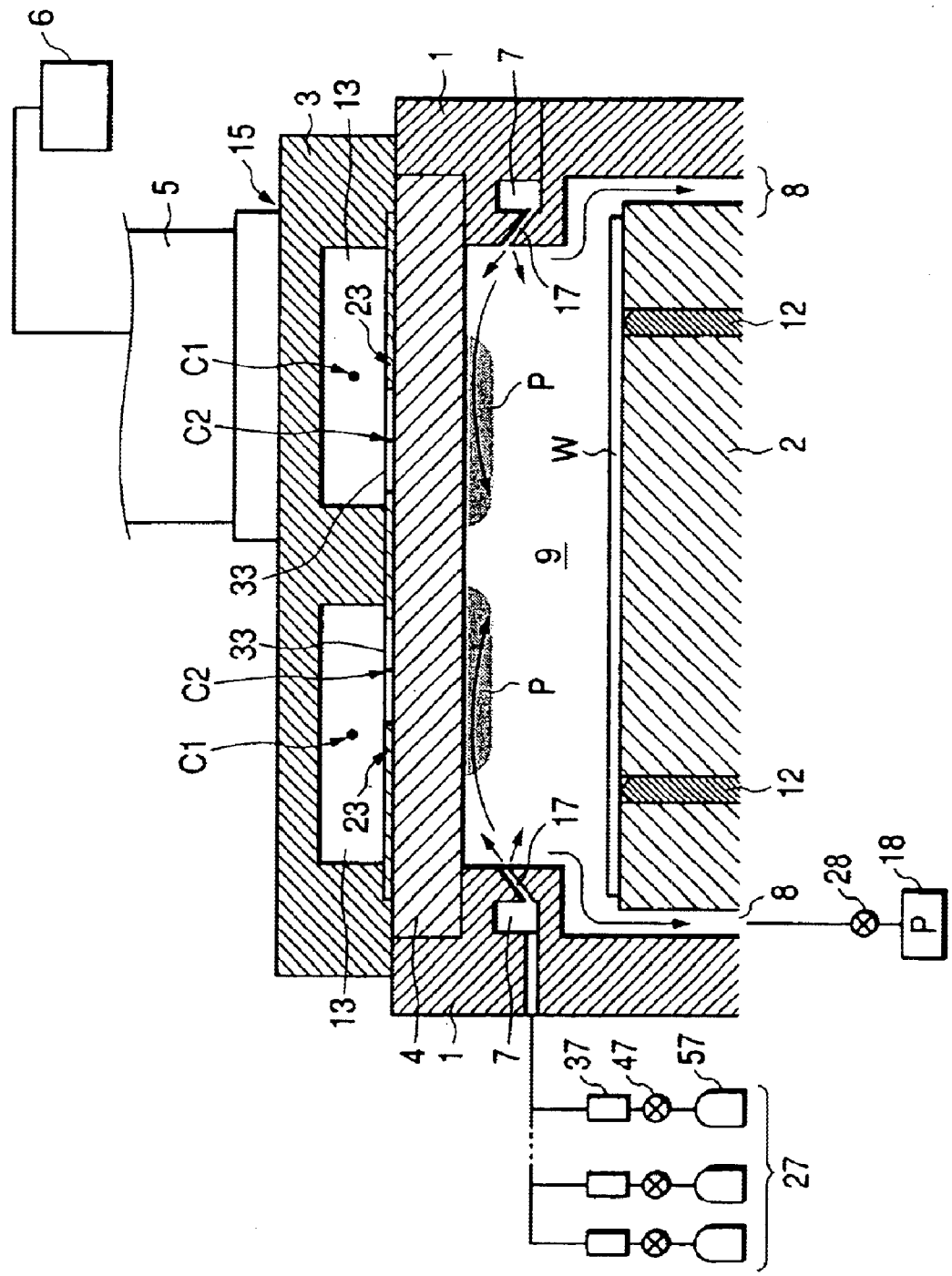
FIG. 1 is a sectional view of a plasma processing apparatus according to the present invention.

FIG. 1 is a schematic sectional view showing a plasma processing apparatus according to a preferred embodiment of the present invention.

The microwave applicator 3 comprising a circular waveguide 13 having a surface provided with a plurality of slots 33 for radiating microwaves is characterized in that the centers C2 of the plurality of slots 33 are offset in a direction parallel to the surface with respect to the center C1 of the circular waveguide 13.

Specifically, reference numeral 1 designates a vacuum container which can house the article to be processed W therein and generate a plasma in the plasma generation chamber 9 and is, for example, a container of an atmosphere-open-type or a container isolated from the atmosphere by a load lock chamber provided adjacent thereto (not shown).

Reference numeral 2 denotes an article holding means called "susceptor" or "holder" for housing the article W in the vacuum container 1 and holding the article, which has lift pins 12 that can elevate and lower the article W and which may further be provided with a temperature controlling means such as a heater for heating the article W or a cooler for cooling the article W as the occasion demands.

Figure 14:
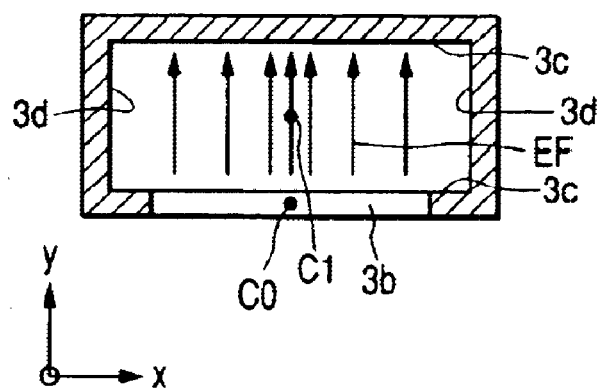
FIG. 14 is a schematic sectional view of a waveguide.

Reference numeral 3 indicates a microwave applicator for supplying microwave energy to generate a plasma in the vacuum container 1 in which the slots 33 are offset inside. Incidentally, the slots shown in FIG. 14 are not offset.

Reference numeral 4 designates a dielectric window that seals the inside of the vacuum container 1 airtight while allowing microwaves to pass therethrough.

Reference numeral 5 denotes a microwave waveguide, and reference numeral 6 denotes a microwave power source.

Reference numeral 7 designates a gas supply passage for supplying a processing gas to be converted into a plasma by microwaves, which obliquely extends upward and has a gas supply port 17 at the end thereof.

The gas supply passage 7 communicates with a gas supply system 27 consisting of gas cylinders 57, valves 47, flow rate controllers 37 and the like.

Reference numeral 8 denotes an exhaust passage for exhausting the inside of the container 1, which communicates via an exhaust opening (not shown) with an exhaust system including a vacuum pump 18, a valve 28, or the like.

Figure 2:
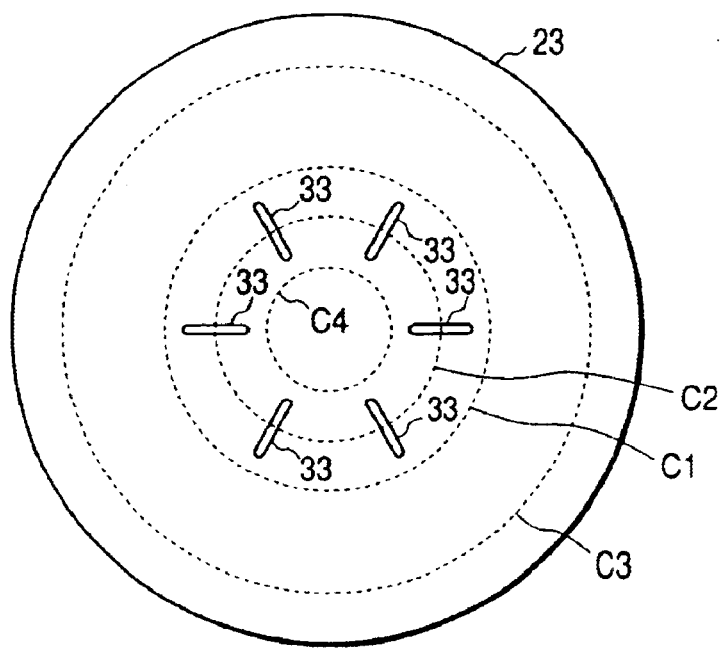
FIG. 2 is a plan view showing an example of a slotted flat plate used in the present invention.

FIG. 2 is a plan view showing an example of the slotted flat plate 23 used in the microwave applicator 3 of the apparatus of FIG. 1.

The slotted flat plate 23 has the plurality of slots 33. The plurality of slots 33 are offset in a direction parallel to the surface of the flat plate 23 such that the line formed by connecting the centers C2 of the slots 33 together is positioned inside in the radial direction of the line formed by connecting the width-wise centers C1 of the circular waveguide 13 together. In the figure, C3 indicates the position of the outer side surface of the circular waveguide 13 and C4 indicates the inner side surface thereof.

A plasma processing method using the apparatus shown in FIG. 1 is described below.

A processing gas is supplied from the gas supply port 17 to the inside of the vacuum container 1, which has been pressure-reduced and exhausted to a predetermined pressure.

The processing gas is emitted to the space 9 which forms a plasma generation chamber and then flows to the exhaust passage 8.

On the other hand, microwaves generated in the microwave power source 6 such as a magnetron are propagated via a waveguide 5 such as a coaxial, cylindrical, or rectangular waveguide and are introduced via the introducing port 15 into the microwave applicator 3.

Microwaves introduced through an upper H-plane opposing one slot 33 are emitted through the slot while propagating through the endless circular waveguide 13 of the microwave applicator 3 clockwise and counterclockwise in the view of FIG. 2.

Since longitudinal slots 33 crossing the propagating/traveling direction of the microwaves propagating and travelling in, e.g., $TE_{10}$ mode through the waveguide are provided in an H-plane of the circular waveguide 13, the microwaves are radiated to the space 9 through the slots 33.

The microwaves are supplied to the space 9 through a microwave transmissive window 4 made of a dielectric.

Figure 15:
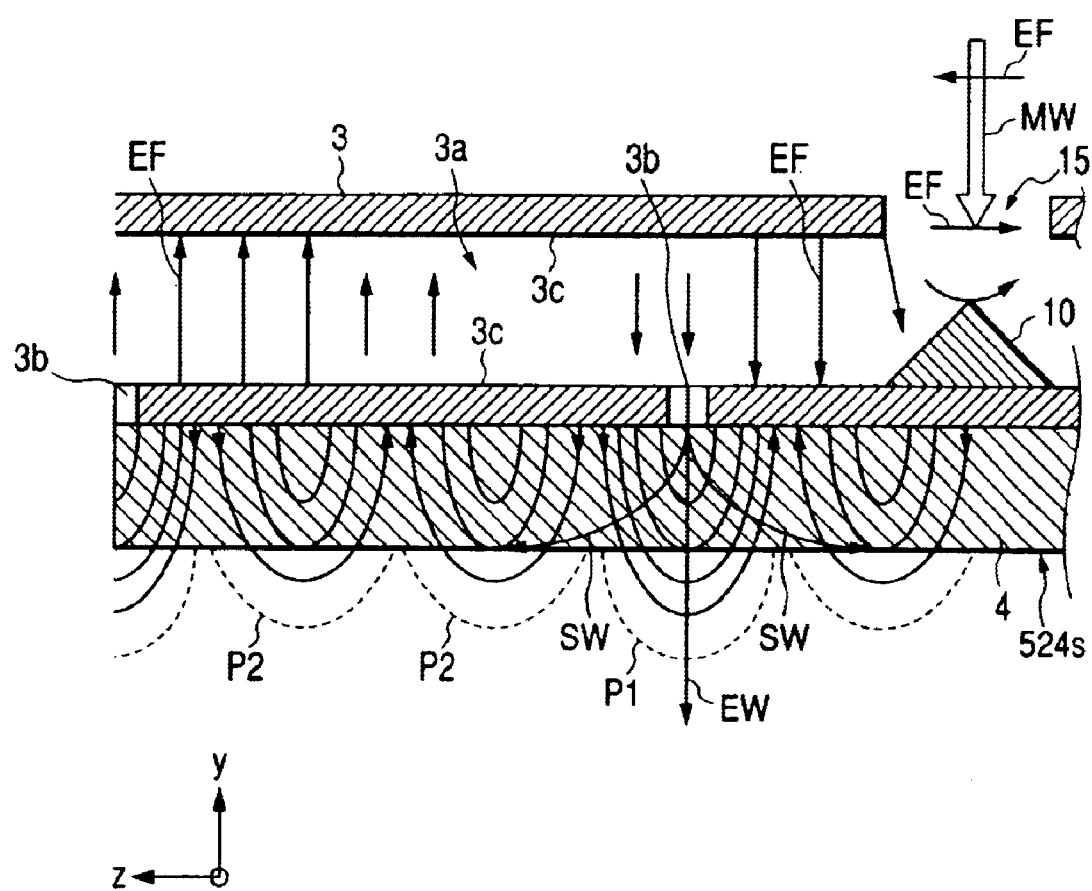
FIG. 15 is a schematic sectional view illustrating radiation of microwaves.

The processing gas present in the space 9 is excited by the microwave energy to generate a plasma P. The mechanism of the microwave radiation and plasma generation is as described with reference to FIG. 15.

The surface of the article W is subjected to a surface treatment using this plasma. The plasma P may be present only under the slots as shown in FIG. 1 or may spread over the entire bottom surface of the dielectric window 4, depending on the power of supplied microwaves and the pressure inside the container.

In contrast to the above mentioned positioning of the slots, the slots may be offset outside depending the size of the article W or the circumferential length of the waveguide of the microwave applicator.

(Embodiment 2)

According to another preferred embodiment of the present invention, there is provided a microwave applicator comprising a circular waveguide having a flat surface provided with a plurality of slots for radiating microwaves, characterized in that the plurality of slots are discontinuous linear slots 33, 34 provided in a direction intersecting the microwave travelling direction.

Figure 3:
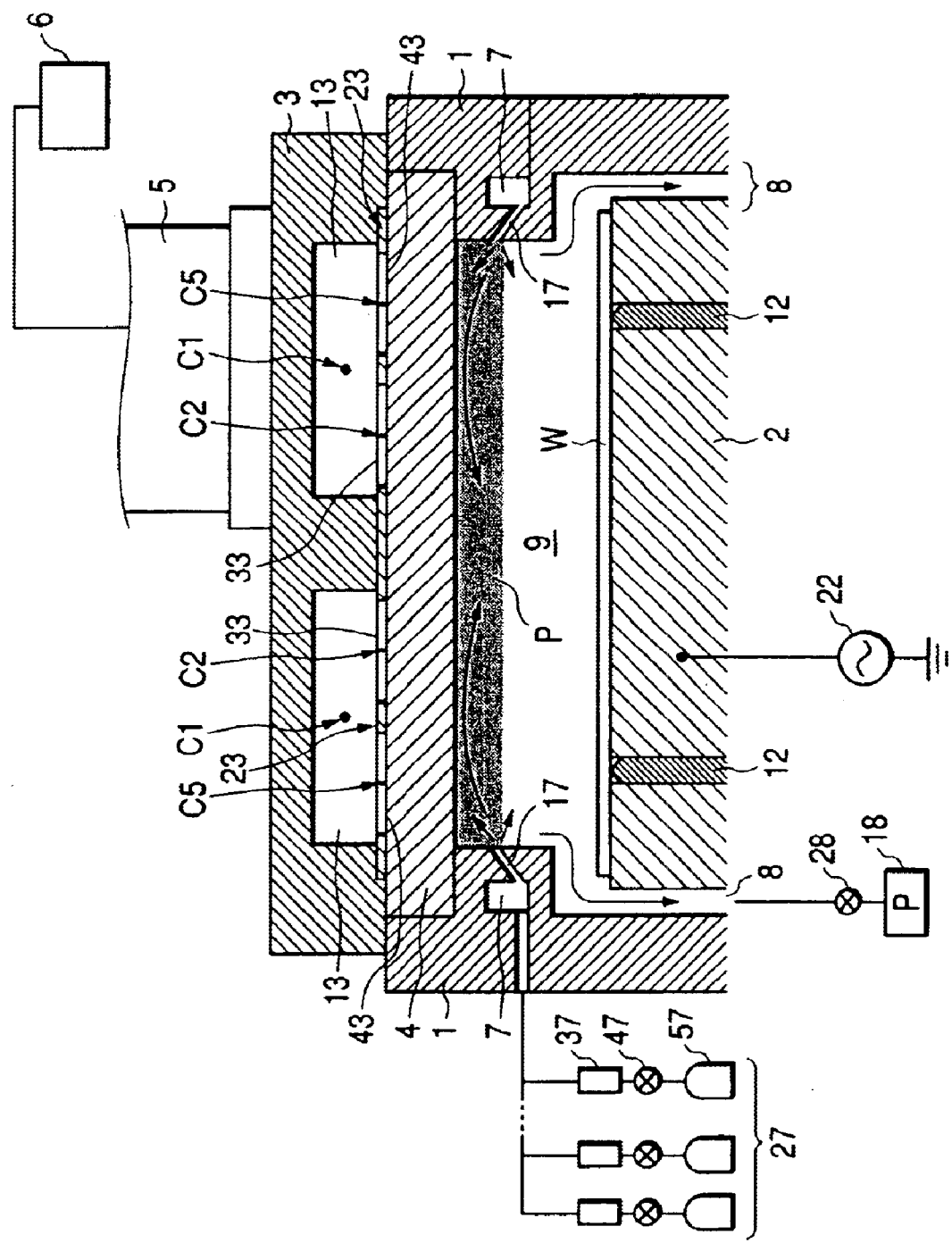
FIG. 3 is a schematic sectional view of another plasma processing apparatus according to the present invention.

FIG. 3 is a schematic sectional view showing such a plasma processing apparatus.

Figure 4:
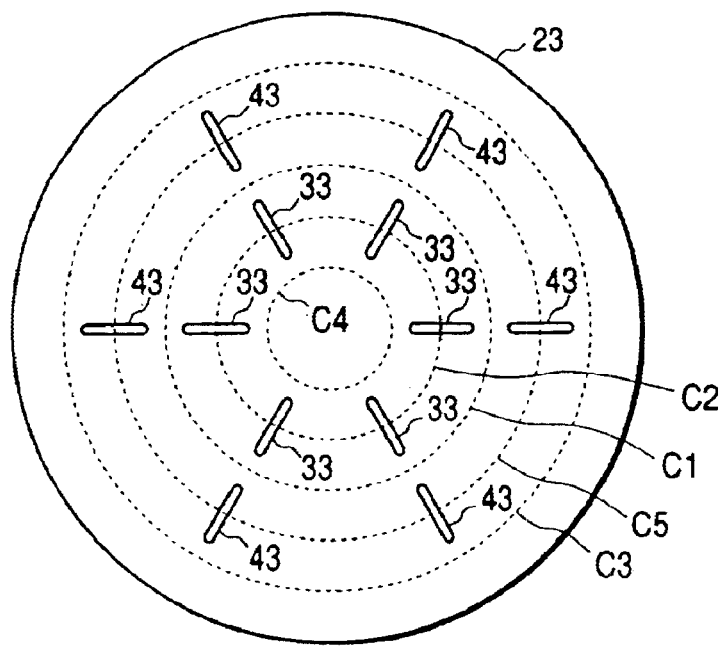
FIG. 4 is a plan view showing another example of a slotted flat plate used in the present invention.

The apparatus has a slotted flat plate 23 as shown in FIG. 4. The apparatus is different from the apparatus of FIG. 1 in provision of the slotted flat plate 23 as shown in FIG. 4 and an article biassing power source 22.

The apparatus is configured such that the pressure inside of the space 9 can be reduced to control the plasma to broaden, and that plasma processing can be carried out while applying a bias voltage to the article from the bias power source 22. This configuration is suitable for etching processing.

Further, it is preferred that the holding means 2 is provided with a cooler to suppress the temperature rise of the article W as the occasion demands.

The same reference numerals as used in FIGS. 1 and 2 denote the same members as those in the apparatus of the embodiment of FIG. 1 and the description thereof is omitted.

FIG. 4 is a plan view showing another example of the slotted flat plate of the microwave applicator used in the present invention.

The slotted flat plate of FIG. 4 is different from that of FIG. 2 in further provision of a plurality of slots 43 on extension lines of the slots 33.

The outer slots 43 are also offset such that the line formed by connecting the centers C5 of the slots 43 together is positioned outside in the radial direction of the line formed by connecting the width-wise centers C1 of the circular waveguide 13 together.

Each pair of the slots 33 and 43 provided in the same radial direction is linearly discontinuous, so that radial radiation of microwaves can be carried out more uniformly than the conventional slots. Further, as compared with the case where a pair of the slots 33 and 43 are integrated into a single long-size slit, circumferential radiation (i.e., radiation in the microwave travelling direction) can be performed more uniformly.

The offset amount of the slots used in the present invention is suitably determined depending on the processing conditions used. Especially, when the slotted flat plate 23 is so configured as to be interchangeable with regard to the conductive base member with a recess for forming the waveguide 13, it is possible to flexibly attend to a change in processing conditions.

The shape of the heterocentral slot used in the present invention in which the center of the slot is different from the center of the circular waveguide may be a single rectangle perforation, or may alternatively be a combination of plural perforations having a length of ¼ to ⅜ of the guide wavelength and arranged discontinuously along a line, as long as the center of each slot is offset inside or outside with regard to the center line of the waveguide.

(Embodiment 3)

Figure 5:
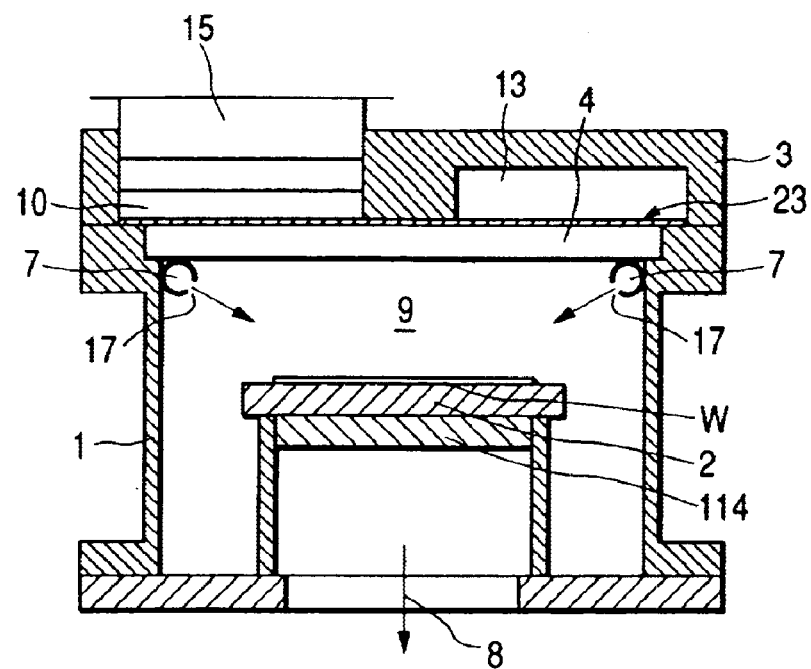
FIG. 5 is a schematic sectional view of a microwave plasma processing apparatus using a circular waveguide according to the present invention.
Figure 6:
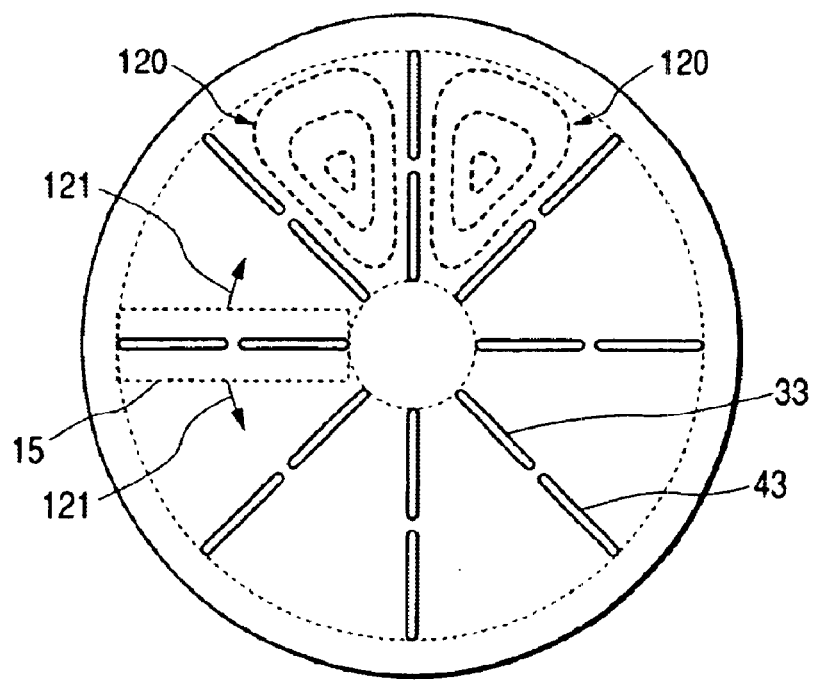
FIG. 6 is a plan view of a slotted flat plate.

With reference to FIGS. 5 and 6, an endless circular waveguide according to another preferred embodiment of the present invention and a microwave plasma processing apparatus using the same are described.

FIG. 5 is a schematic longitudinal sectional view of a microwave plasma processing apparatus using a circular waveguide having a flat plate with discontinuous linear slots as a example of the present invention, and FIG. 6 is a plan view of the slotted plate of the circular waveguide of FIG. 5.

The apparatus is different from the apparatus shown in FIGS. 3 and 4 in that the size of the circular waveguide (microwave applicator) 3 is larger than that of the article W, that the gas supply port 17 is provided downward, and that there are eight pairs of discontinuous linear slots 33, 43 as offset inside and outside, respectively. Further, the holding means 2 is provided with a heater 114 for temperature control of the article W.

The exhaust system and gas supply system may be the same as shown in FIGS. 1 and 3.

In FIG. 5, the slots 33 and 43 are not depicted for convenience sake.

The generation of a plasma and the processing are carried out as follows. The inside of the container 1 is evacuated via an exhaust system (not shown). Subsequently, a plasma processing gas is introduced at a predetermined flow rate into the container 1 via the gas supply passage 7. Then, a conductance valve (not shown) provided in the exhaust system (not shown) is adjusted to maintain the inside of the container 1 at a predetermined pressure. A desired power from a microwave power source (not shown) is introduced into the container 1 through the microwave applicator 3 to generate a plasma in the container 1. At this time, the introduced processing gas is excited, decomposed, or ionized by the high density plasma as generated to process the surface of the article W put on the holding means 102.

As the material of the circular waveguide which forms the microwave applicator used in the microwave plasma processing apparatus according to the present invention, any conductor may be used, but an optimal material is stainless steel plated with Al, Cu, or Ag/Cu that has a high conductivity in order to minimize the propagation loss of microwaves.

The direction of the microwave introducing port 15 of the circular waveguide used in the present invention may be perpendicular to the H-plane as shown in the figures so that microwaves are distributed at the introducing section to the right and left directions relative to the microwave propagation space or may be parallel to the H-plane and tangential relative to the propagation space, as long as it can efficiently introduce microwaves into the waveguide in the microwave applicator.

The slot interval in the microwave travelling direction of the microwave applicator used in the present invention is optimally ½ of the guide wavelength. In the present invention, the length of each of the continuous portions of the discontinuous slot, i.e., the lengths of the slots 33 and 43 are each preferably within the range of ¼ to ⅜ of the guide wavelength.

The discontinuous linear slot 33, 43 is in a direction which intersects the microwave travelling direction 121. That is, the longitudinal direction of the slot intersects the microwave travelling direction 121, for example, perpendicularly in this embodiment. In this embodiment, since a rectangular waveguide is shaped like a ring (not limited to a circular ring but including an ellipsoidal, square, pentagonal ring, or the like) to be circular, and since microwaves of $TE_{10}$ mode ($H_{01}$ mode) are allowed to propagate therein, one discontinuous linear slot (one pair of slots) corresponds to one loop of the oscillation. In the figure, reference numeral 120 schematically show the magnetic field.

A material suitable for the dielectric window 4 is anhydrous synthetic quartz, and the window has a diameter 299 mm and a thickness 12 mm. The circular waveguide 3 having the flat plate with discontinuous linear slots (hereinafter, simply referred to as "flat plate type circular waveguide) has a 27 mm×96 mm inner wall cross section and a central diameter of 202 mm. As the material of the flat plate type circular waveguide 3, Al is used entirely in order to suppress the propagation loss of microwaves. In the H-plane of the circular waveguide 3, are formed eight pairs of the discontinuous linear slots 33, 43. Inside and outside of the center line of the waveguide, is arranged each pair of rectangular slots of 42 mm in length and 3 mm in width linearly, and the respective pairs of slots are formed radially at an interval of ½ of the guide wavelength. Although the guide wavelength depends on the frequency of microwaves used and the size of the cross section of the waveguide, the use of microwaves of a frequency 2.45 GHz and a waveguide of the above mentioned size provides a guide wavelength of about 159 mm. In the circular waveguide 103 used, there are formed rectangular slots of 42 mm in length and 3 mm in width in the total number of sixteen (16) inside and outside the center line of the waveguide at an interval of 45°. To the circular waveguide 3, are connected a 4E tuner, a directional coupler, an isolator, and a microwave power source (not shown) of frequency 2.45 GHz in this order.

The microwave plasma processing apparatus shown in FIGS. 5 and 6 was used to generate a plasma under the conditions of an Ar flow rate of 500 sccm, pressures of 1.33 Pa and 133 Pa, and a microwave power of 3.0 kW, and the plasma obtained was measured. The plasma was measured as follows using a single probe method. The voltage applied to the probe was varied within a range of −50 V to +100 V, and a current flowing through the probe was measured by an I-V measuring device. The electron density, the electron temperature and the plasma potential were calculated from the thus obtained I-V curve by the Langmuir method. As a result, the electron density was $2.1 \times 10^{12}/cm^3 \pm 2.7\%$ (within φ 300 plane) at 1.33 Pa and $9.6 \times 10^{11}/cm^3 \pm 5.4\%$ (within φ 300 plane) at 133 Pa, and it was confirmed that a high density, uniform plasma was formed even in a high pressure region. The expression "within φ 300 plane" means the inside of a circle of 300 mm in diameter.

[Embodiment 4]

Figure 7:
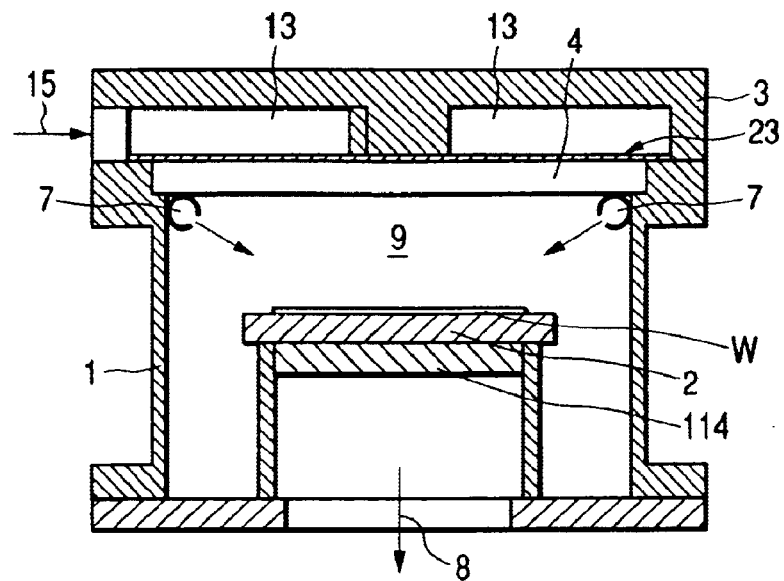
FIG. 7 is a schematic sectional view of a microwave plasma processing apparatus using a tangential introduction type circular waveguide according to the present invention.

FIG. 7 is a schematic longitudinal sectional view of a microwave plasma processing apparatus using a tangential introduction type circular waveguide of the flat plate type.

The generation of plasma and processing is the same as in the previously described embodiments.

A desired power from a microwave power source (not shown) is introduced into a flat plate type circular waveguide 3 through an introducing port 15 formed in the E-plane. The introduced microwaves are supplied to the inside of the plasma generation space 9 through the dielectric window 4 via slots formed at an interval of ½ of the guide wavelength. Microwaves that have propagated through the waveguide 3 one round without being introduced to the space 9 interfere with newly introduced microwaves near the introducing portion 15 to strengthen each other, and most of the microwaves are introduced to the inside of the plasma generation space 9 before they have propagated through the waveguide several rounds. In the figure, the configuration of the other portion than the microwave introducing port 15 is the same as Embodiment 3. Further, FIG. 7 is depicted with the slots omitted for convenience sake.

The microwave plasma processing apparatus shown in FIG. 7 was used to generate a plasma under the conditions of an Ar flow rate of 500 sccm, pressures of 1.33 Pa and 133 Pa, and a microwave power of 3.0 kW, and the plasma obtained was measured. The plasma was measured as follows using a single probe method. The voltage applied to the probe was varied within a range of −50 V to +100 V, and a current flowing through the probe was measured by an I-V measuring device. The electron density, the electron temperature and the plasma potential were calculated from the thus obtained I-V curve by the Langmuir method. As a result, the electron density was $1.9 \times 10^{12}/cm^3 \pm 2.7\%$ (within φ 300 plane) at 1.33 Pa and $8.7 \times 10^{11}/cm^3 \pm 5.6\%$ (within φ 300 plane) at 133 Pa, and it was confirmed that a high density, uniform plasma was formed even in a high pressure region.

(Embodiment 5)

Figure 8:
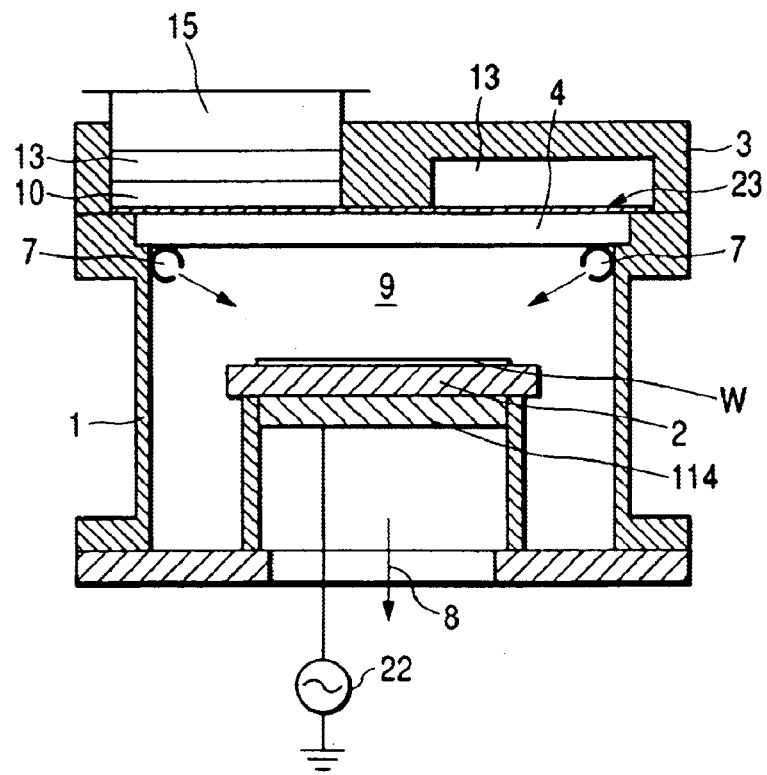
FIG. 8 is a schematic sectional view of another microwave plasma processing apparatus according to the present invention.

FIG. 8 is a schematic longitudinal sectional view of a microwave plasma processing apparatus using an RF bias application mechanism. In the figure, reference numeral 22 denotes an RF bias application means. FIG. 8 is also depicted with the slots omitted for convenience sake.

The generation of a plasma and the processing are carried out as follows. The article W is put on the holding means 2 and is heated to a desired temperature using the heater 114. The plasma generation space 9 is evacuated via an exhaust system (not shown). Subsequently, a plasma processing gas is introduced at a predetermined flow rate into the plasma generation space 9. Then, a conductance valve (not shown) provided in the exhaust system (not shown) is adjusted to maintain the plasma generation space 9 at a predetermined pressure. The RF bias application means 22 is used to supply an RF power to the holding means 22, while a desired power from a microwave power source (not shown) is introduced into the plasma generation space 9 through the dielectric window 4 via the flat plate type circular waveguide 3. The electric field of the introduced microwaves accelerates electrons to generate a plasma in the plasma generation space 9. At this time, the processing gas is excited, decomposed or ionized by the high density plasma generated to process the surface of the article W. In addition, the RF bias can be used to control the kinetic energy of ions incident upon the article.

(Embodiment 6)

Figure 9:
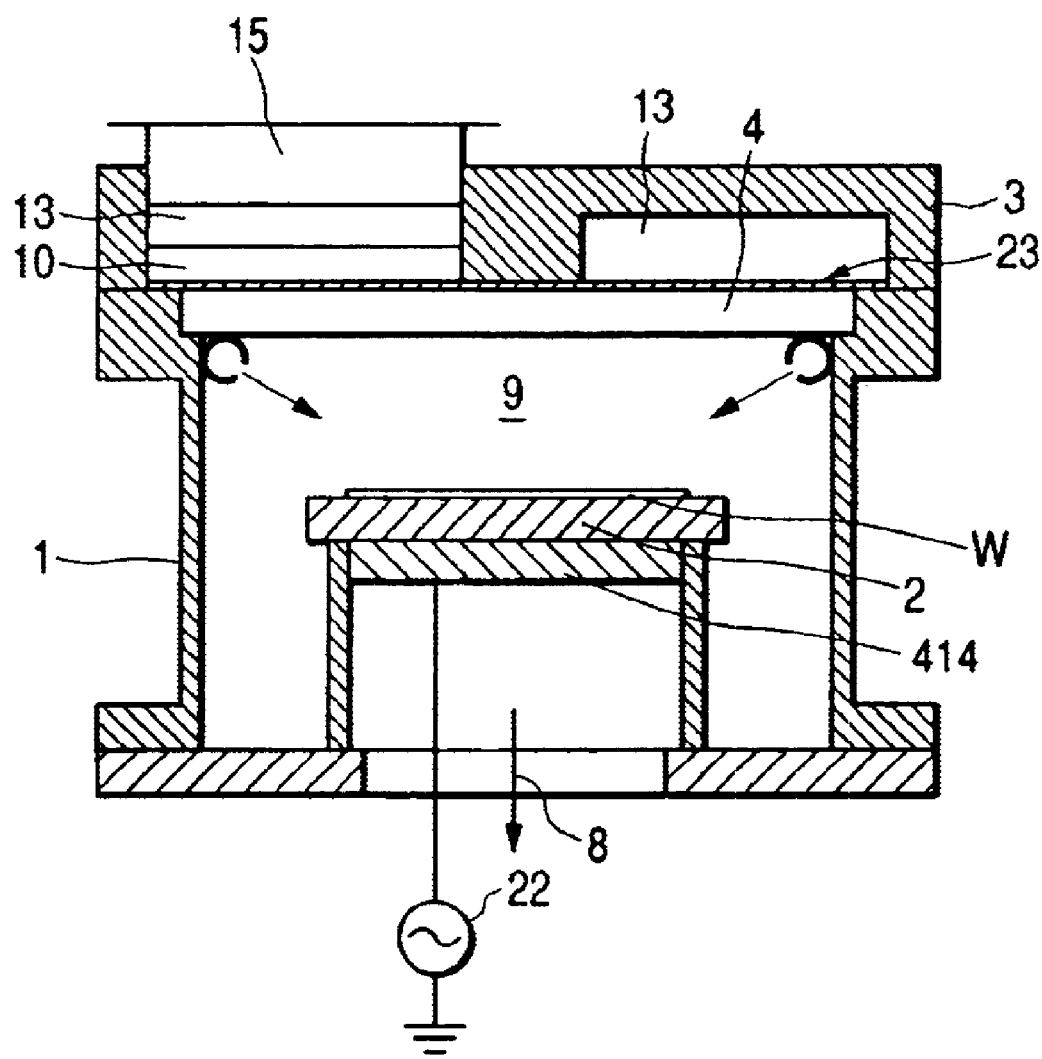
FIG. 9 is a schematic sectional view of still another microwave plasma processing apparatus according to the present invention.

FIG. 9 is a schematic longitudinal sectional view of a microwave plasma processing apparatus having a cooling mechanism for temperature control. In the figure, reference numeral 414 denotes a cooler for cooling the article. FIG. 9 is also depicted with the slots omitted for convenience sake.

The generation of a plasma and the processing are carried out as follows. The article W is put on the holding means 102 and is cooled using the cooler 414. The plasma generation space 9 is evacuated via an exhaust system (not shown). Subsequently, a plasma processing gas is introduced. Then, a conductance valve (not shown) provided in the exhaust system (not shown) is adjusted to maintain the inside of the plasma generation space 9 at a predetermined pressure. The RF bias application means 302 is used to supply an RF power to the holding means 2, while a desired power from a microwave power source (not shown) is introduced into the plasma generation space 9 through the dielectric window 4 via the flat plate type circular waveguide 3. The electric field of the microwaves introduced accelerates electrons to generate a plasma. Using the cooler 414 can suppress the overheating of the article caused by ion incidence when a high density plasma and a high bias are used.

(Embodiment 7)

A seventh embodiment of the present invention will be described below.

Figure 16A:
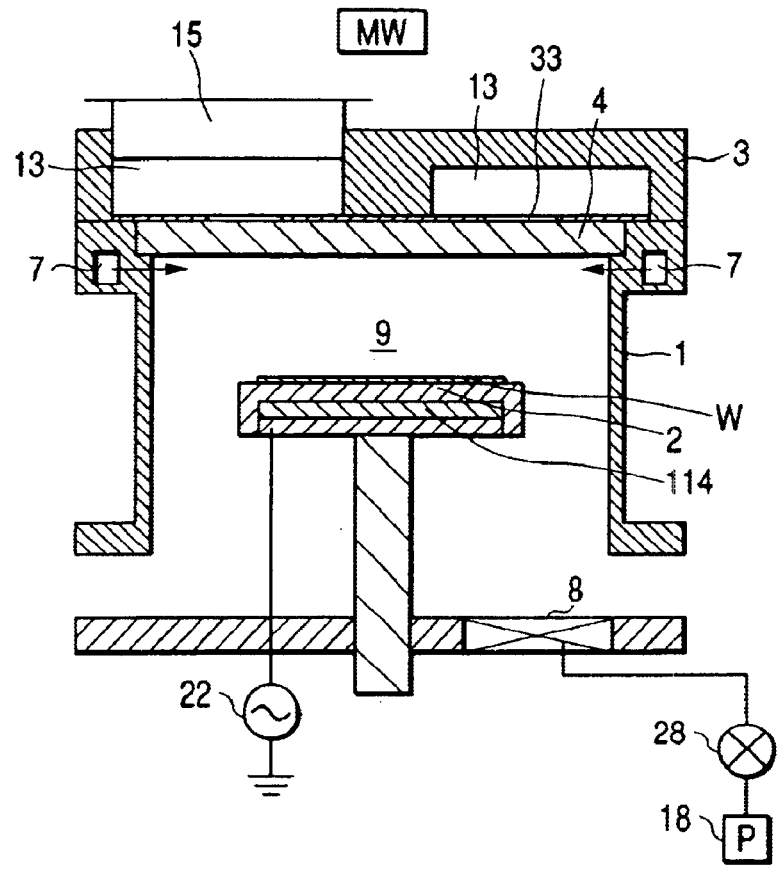
FIG. 16A is a schematic sectional view showing a plasma processing apparatus according to another embodiment of the present invention.
Figure 16B:
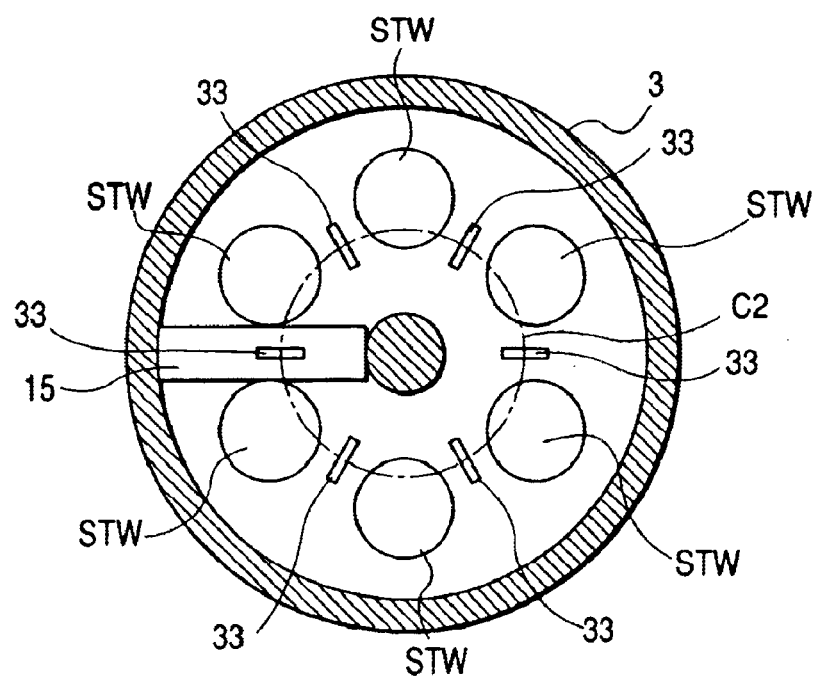
FIG. 16B is a schematic view of a microwave applicator used in the present invention.
Figure 16C:
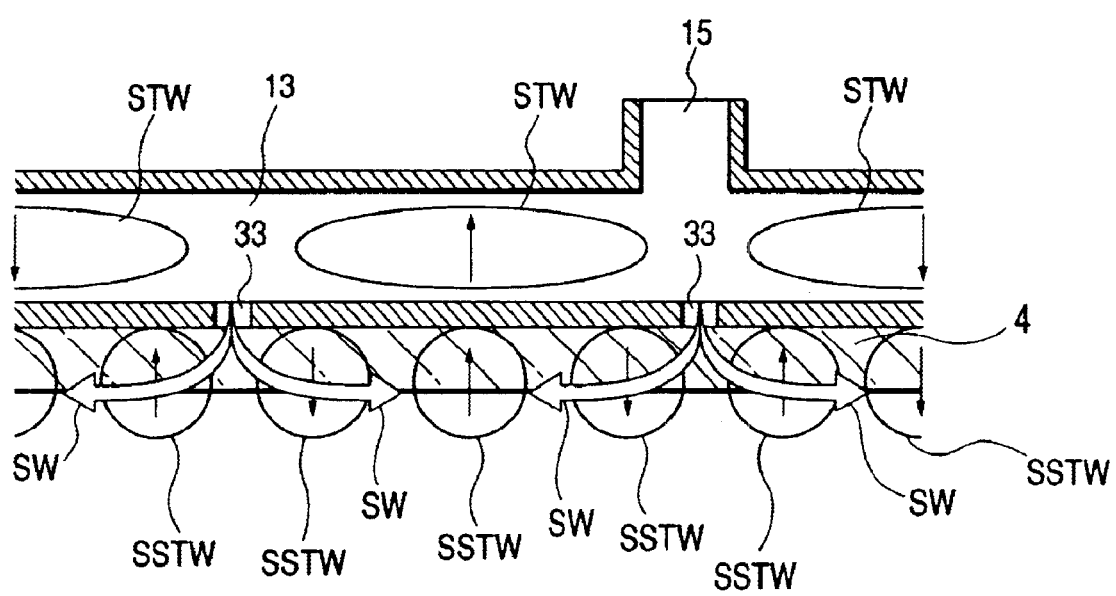
FIG. 16C is a schematic view showing the state of microwave propagation in a microwave applicator used in the present invention.

FIGS. 16A to 16C are schematic views showing a microwave plasma processing apparatus. Specifically, FIG. 16A is a schematic sectional view of the apparatus; FIG. 16B is a schematic plan view of a microwave applicator of the apparatus; and FIG. 16C is a schematic view showing the state of microwave propagation in the microwave applicator.

In the figures, reference numeral 1 designates a container that defines a plasma processing chamber 9 therein; W is an article to be processed; 2 is a supporting means for holding the article; 114 is a means for adjusting the temperature of the article W; 22 is a high frequency bias applying means; 7 is a processing gas supply port; 18 is an exhaust means such as an exhaust pump; 28 is an exhaust conductance adjusting means; 4 is a dielectric window for isolating the plasma processing chamber 9 from the atmosphere; 3 is a microwave applicator comprised of an endless circular waveguide with slots for introducing microwaves into the plasma processing chamber 9 through the dielectric window 4; 13 is a microwave waveguide in the endless circular waveguide; 15 is a microwave introducing port that forms an E-junction for distributing the microwaves introduced in the endless circular waveguide into the right and the left; STW is standing waves generated by interference of microwaves distributed by the E-junction and propagating in the waveguide; and 33 is a plurality of slots provided by perforating a plane (here H-plane) in contact with the dielectric window 4 at a predetermined interval.

Further, reference numeral SW designates surface waves introduced through the slots 33 and propagating in the surface of the dielectric window 4, and SSTW denotes surface standing waves generated by interference of the surface waves SW emitted from the adjoining slots 33. Since a plasma is generated on the lower side of the dielectric window 4 by electronic excitation with the surface standing waves SSTW, the plasma is called a surface-wave interfered plasma.

In the present embodiment, the slots 33 are not located on the center line of the microwave waveguide 13 of the endless circular waveguide, but are located such that the centers of slots 33 are on a circle C2 having a radius $r_c$ approximately represented by $$r_c = n_1 \lambda_s / \{2 \tan(\pi/(2n_g))\} \{1 + \cos(\pi/n_g)\}$$

wherein $n_1$ is the number of antinodes of surface standing waves SSTW generated between slots 33, $\lambda_s$ is the wavelength of the surface waves SW, $n_g$ is the multiplicative number of the circumferential length $l_g$ of the circular waveguide 13 with regard to the guide wavelength $\lambda_g$ (i.e., the ratio $l_g/\lambda_g$).

The reason for the above will be described below with reference to FIG. 17.

In a case where it can be approximated that an odd number of surface standing waves SSTW are generated in plurality in a direction parallel to the direction of arrangement of the slots between slots 33 by interference of the surface waves SW generated from adjoining slots 33, the surface standing waves SSTW are generated at an interval of ½ of the wavelength $\lambda_s$ of the surface waves SW. Therefore, in order to most efficiently generate the surface standing waves SSTW equidistant from each other, the propagation length of the surface waves SW between slots (which is the same as the distance L between central standing waves) needs to be set as follows.

$$L=n_1\lambda_s/2$$

In a general case where it can not be approximated that the direction of arrangement of the slots and the direction of arrangement of the surface standing waves SSTW generated in plurality are parallel to each other, the propagation length L needs to be alternatively set as follows.

$$L=n_1\lambda_s/\{1+\cos(\pi/n_g)\}$$

Further, the propagation length L is also represented using the radius $r_c$ of the circle on which the centers of the slots should exist and a half angle θ of the angular spacing $\pi/n_g$ of the slots as follows.

$$L=2r_c \tan\theta=2r_c \tan(\pi/2n_g)$$

Accordingly, the radius $r_c$ of the circle on which the centers of the slots should exist (hereinafter, simply referred to as "slot center radius $r_c$") is represented as follows.

$$r_c=n_1\lambda_s/\{2 \tan(\pi/(2n_g))\}\{1+\cos(\pi/n_g)\}$$

In this case, it is preferred that the value of $n_g$ (=$l_{g/\lambda g}$) is within the range of 2 to 5. Further, it is preferred that the number $n_1$ of antinodes of the surface standing waves SSTW generated between slots 33 (hereinafter, simply referred to as "interslot surface standing wave antinode number $n_1$") is any one of 3, 5 or 7.

For example, the slot center radii $r_c$ when the interslot surface standing wave antinode number $n_1$ is 3 or 5, the microwave frequency is 2.45 GHz ($\lambda_o$: 22.44 mm), $n_g$ is 2, 3 or 4, and the material of the dielectric window is quartz glass (dielectric constant $\in_w$: 3.8) or aluminium nitride (dielectric constant $\in_w$: 9.8) are shown in TABLE 1.

TABLE 1

| Dielectric ($\in_w$) | $n_1$ | $n_g = 2$ | $n_g = 3$ | $n_g = 4$ |
|---|---|---|---|---|
| quartz glass (3.8) | 3 | 78.6 mm | 103.9 mm | 129.2 mm |
| aluminium nitride (9.8) | 3 | 58.7 mm | 67.7 mm | 82.9 mm |
| aluminium nitride (9.8) | 5 | 76.6 mm | 101.9 mm | 127.2 mm |

The generation of a plasma and the processing using the microwave plasma processing apparatus are carried out as follows.

First, the plasma processing chamber 9 is evacuated via the exhaust means 18. Subsequently, a plasma processing gas is introduced at a predetermined flow rate into the plasma processing chamber 9 via the processing gas supply port 7.

Then, the conductance adjusting means 28 provided between the plasma processing chamber 9 and the exhaust means 18 is adjusted to maintain the plasma processing chamber 9 at a predetermined pressure. If necessary, a bias voltage is applied to the article W with the high frequency bias applying means 22. A desired power from a microwave power source MW is supplied into the plasma processing chamber 9 through the endless circular waveguide 13.

At this time, microwaves of $TE_{10}$ mode introduced into the endless circular waveguide 13 are distributed into two of the right and left at the E-junction of the introducing port 15 and propagate within the waveguide 13 at a guide wavelength longer than the wavelength in the free space. The distributed microwaves interfere with each other to generate standing waves STW having an "antinode" at every ½ of the guide wavelength. Microwaves introduced into the plasma processing chamber 9 through the dielectric window 4 from the slots 33 provided at such positions as to maximize the current flowing the conductive plane (H-plane in this case) of the waveguide 13, i.e., at the centers between adjoining two antinodes generate a plasma in the vicinity of the slots 33.

When the electron plasma frequency of the generated plasma exceeds the power source frequency (for example, when the electron plasma frequency exceeds the power source frequency of 2.45 GHz in the case where the electron density exceeds $7\times10^{10}$ cm$^{-3}$), the so-called cut-off in which microwaves can not propagate through the plasma is caused. Further, when the electron density increases and the skin depth δ defined by $$\delta=(2/\omega\mu_o\sigma)^{1/2}$$

(wherein, ω is the angular frequency of a power source, $\mu_o$ is the space permeability, and σ is the plasma conductivity) becomes sufficiently small (for example, when the electron density becomes $2\times10^{12}$ cm$^{-3}$ or more), the skin depth becomes 4 mm or less, the microwaves propagate as the surface waves SW in the surface of the dielectric window 4.

Surface waves SW introduced via adjoining slots 33 interfere with each other to generate surface standing waves SSTW at every half of the wavelength of surface waves SW approximately represented by $$\lambda_s=\lambda_o\in_r^{-1/2}$$

wherein, $\lambda_o$ is the free-space microwave wavelength, and $\in_r$ is the dielectric constant of the dielectric.

The surface standing waves SSTW leaked to the plasma processing chamber 9 accelerate electrons, thus generating a surface-wave interfered plasma (SIP). At this time, when a processing gas is introduced through the processing gas supply port 7 into the plasma processing chamber 9, the processing gas is excited by the thus generated high density plasma to process a surface of the article W placed on the support means 2. The shape of the slots 33 provided in the microwave plasma processing apparatus in accordance with the present embodiment need not necessarily be a rectangle perforation with a length of ¼ to ⅜ of the guide wavelength as long as the centers of the slots 33 are on the circle C2 having a radius $r_c$ approximately represented by $$r_c=n_1\lambda_s/\{2 \tan(\pi/(2n_g))\}\{1+\cos(\pi/n_g)\}.$$

(Embodiment 8)

A microwave applicator of the microwave plasma processing apparatus in accordance with an eighth embodiment of the present invention will be described with reference to FIG. 18 in which $n_g$ is 3, the interslot surface standing wave antinode number $n_1$ is 3, and the material of the dielectric window is quartz glass (dielectric constant $\in_w$: 3.8). The configuration of the apparatus body is similar to that shown in FIGS. 16A to 16C.

In the present embodiment, the slots 33 are formed such that the centers of the slots are on a circle C5 with a radius $r_c$ of about 103.9 mm outside the center line of the microwave waveguide 13 of the endless circular waveguide. The radius $r_c$ of the circle C5 satisfies the above mentioned equality.

With the apparatus of the above mentioned configuration, microwaves of $TE_{10}$ mode introduced into the endless circular waveguide 13 are distributed into two of the right and left at the E-junction and propagate within the waveguide 13 at a guide wavelength longer than the wavelength in the free space. The distributed microwaves interfere with each other to generate standing waves STW having six "antinodes" at every ½ of the guide wavelength. Microwaves introduced into the plasma processing chamber 9 through the dielectric window 4 from the slots 33 provided at such positions as to maximize the current, i.e., at the centers between adjoining two antinodes generate a plasma in the vicinity of the slots 33.

When the electron plasma frequency of the generated plasma exceeds the power source frequency (for example, when the electron plasma frequency exceeds the power source frequency of 2.45 GHz in the case where the electron density exceeds $7 \times 10^{10}$ cm$^{-3}$), the so-called cut-off in which microwaves can not propagate through the plasma is caused. Further, when the electron density increases and the skin depth δ defined by $$\delta = (2/\omega\mu_o\sigma)^{1/2}$$

(wherein, ω is the angular frequency of a power source, $\mu_o$ is the space permeability, and σ is the plasma conductivity) becomes sufficiently small (for example, when the electron density becomes $2 \times 10^{12}$ cm$^{-3}$ or more, the skin depth becomes 4 mm or less), the microwaves propagate as the surface waves SW in the surface of the dielectric window 4 made of the quartz glass.

Surface waves SW introduced via adjoining slots 33 interfere with each other to generate surface standing waves SSTW at about every 31 mm (i.e., at an interval of about 31 mm).

The surface standing waves SSTW leaked to the plasma processing chamber accelerate electrons, thus generating a surface-wave interfered plasma SIP.

The material of the dielectric window is anhydrous synthetic quartz, and the window has a diameter 300 mm and a thickness 12 mm. The endless circular waveguide has a 27 mm×96 mm inner wall cross section and a central diameter of 152 mm (the circumferential length $l_g$ of the waveguide being three times the guide wavelength $\lambda_g$).

As the material of the endless circular waveguide 3, Al is used entirely in order to suppress the propagation loss of microwaves. In the H-plane of the endless circular waveguide 3, are formed slots 33 for introducing microwaves into the plasma processing chamber 9. The slots 33 each have a rectangular shape of 40 mm in length and 4 mm in width, and are formed radially at an interval of 60° in the total number of six (6) with the centers of the slots being on the circle C5 of the radius of 103.9 mm. To the endless circular waveguide, are connected a 4E tuner, a directional coupler, an isolator, and a microwave power source (not shown) of frequency 2.45 GHz in this order.

Figure 18:
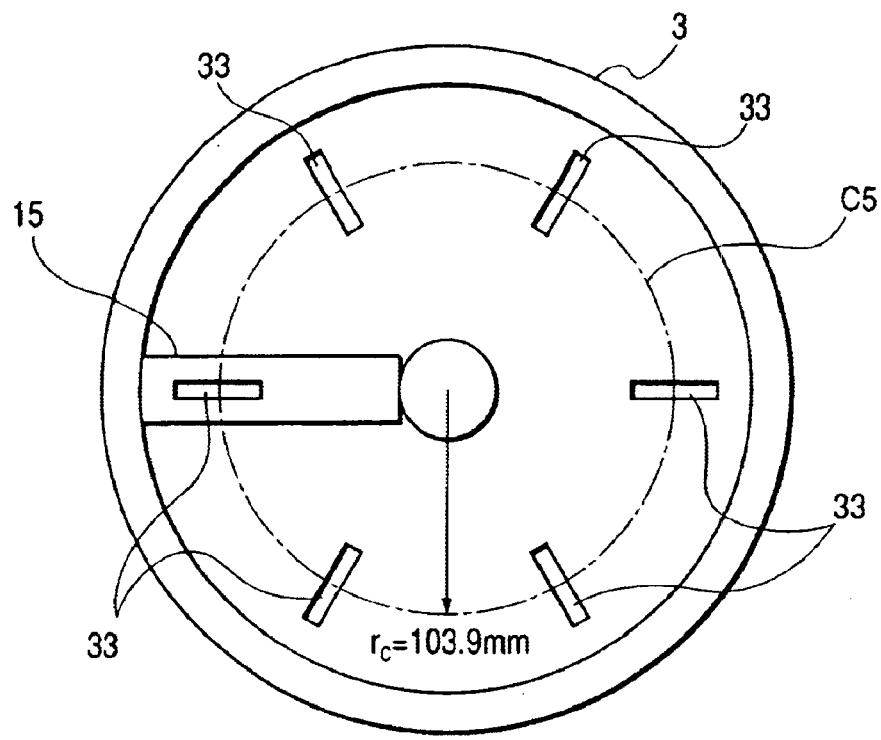
FIG. 18 is a schematic view of a microwave applicator used in the present invention.

The microwave plasma processing apparatus with the microwave applicator shown in FIG. 18 was used to generate a plasma under the conditions of an Ar flow rate of 500 sccm, a pressure of 1.33 Pa, and a microwave power of 3.0 kW, and the plasma obtained was measured. The plasma was measured as follows using a single probe method. The voltage applied to the probe was varied within the range of −50 V to +100 V, and a current flowing through the probe was measured by an I-V measuring device, and the electron density, the electron temperature and the plasma potential were calculated from the thus obtained I-V curve by the Langmuir method. As a result, the electron density was $2.1 \times 10^{12}$/cm$^3$±2.7% (within φ 300 plane) at 1.33 Pa, and it was confirmed that a high electron density, stable plasma was formed even in a low pressure region.

(Embodiment 9)

A microwave applicator of the microwave plasma processing apparatus in accordance with a ninth embodiment of the present invention will be described with reference to FIG. 19 in which the (waveguide circumferential length)/(guide wavelength) ratio $n_g$ is 3, the interslot surface standing wave antinode number $n_1$ is 3, and the material of the dielectric window is aluminium nitride (dielectric constant $\in_w$: 9.8). The configuration of the apparatus body is similar to that shown in FIGS. 16A to 16C.

In the present embodiment, the slots 33 are formed offset such that the centers of slots are on a circle C2 with a radius $r_c$ of about 67.7 mm inside the center line of the microwave waveguide 13 of the endless circular waveguide. The radius $r_c$ of the circle C2 satisfies the above mentioned equality.

With the apparatus of the above mentioned configuration, microwaves of $TE_{10}$ mode introduced into the endless circular waveguide 13 are distributed into two of the right and left at the E-junction and propagate within the waveguide 13 at a guide wavelength longer than the wavelength in the free space. The distributed microwaves interfere with each other to generate standing waves STW at every ½ of the guide wavelength. Microwaves introduced into the plasma processing chamber 9 through the dielectric window 4 made of aluminium nitride from the slots 33 provided at such positions as to maximize the current, i.e., at the centers between adjoining two standing waves generate a plasma in the vicinity of the slots 33. When the electron plasma frequency of the generated plasma exceeds the power source frequency (for example, when the electron plasma frequency exceeds the power source frequency of 2.45 GHz in the case where the electron density exceeds $7 \times 10^{10}$ cm$^{-3}$), the so-called cut-off in which microwaves can not propagate through the plasma is caused. Further, when the electron density increases and the skin depth δ defined by $$\delta = (2/\omega\mu_o\sigma)^{1/2}$$

(wherein, ω is the angular frequency of a power source, $\mu_o$ the space permeability, and σ is the plasma conductivity) becomes sufficiently small (for example, when the electron density becomes $2 \times 10^{12}$ cm$^{-3}$ or more, the skin depth becomes 4 mm or less), the microwaves propagate as the surface waves SW in the surface of the dielectric window 4.

Surface waves SW introduced via adjoining slots 33 interfere with each other to generate surface standing waves SSTW at about every 20 mm. The surface standing waves SSTW leaked to the plasma processing chamber accelerate electrons, thus generating a surface-wave interfered plasma SIP.

The dielectric window 4 of aluminium nitride has a diameter 300 mm and a thickness 12 mm. The endless circular waveguide has a 27 mm×96 mm inner wall cross section and a central diameter of 152 mm (the circumferential length $l_g$ of the waveguide being three times the guide wavelength $\lambda_g$). As the material of the endless circular waveguide 3, Al is used entirely in order to suppress the propagation loss of microwaves.

In the H-plane of the endless circular waveguide 3, are formed slots 33 for introducing microwaves into the plasma processing chamber 9. The slots 33 each have a rectangular shape of 40 mm in length and 4 mm in width, and are formed radially at an interval of 60° in the total number of six (6) with the centers of the slots being on the circle C2 of the radius of 67.7 mm. To the endless circular waveguide, are connected a 4E tuner, a directional coupler, an isolator, and a microwave power source (not shown) of frequency 2.45 GHz in this order.

Figure 19:
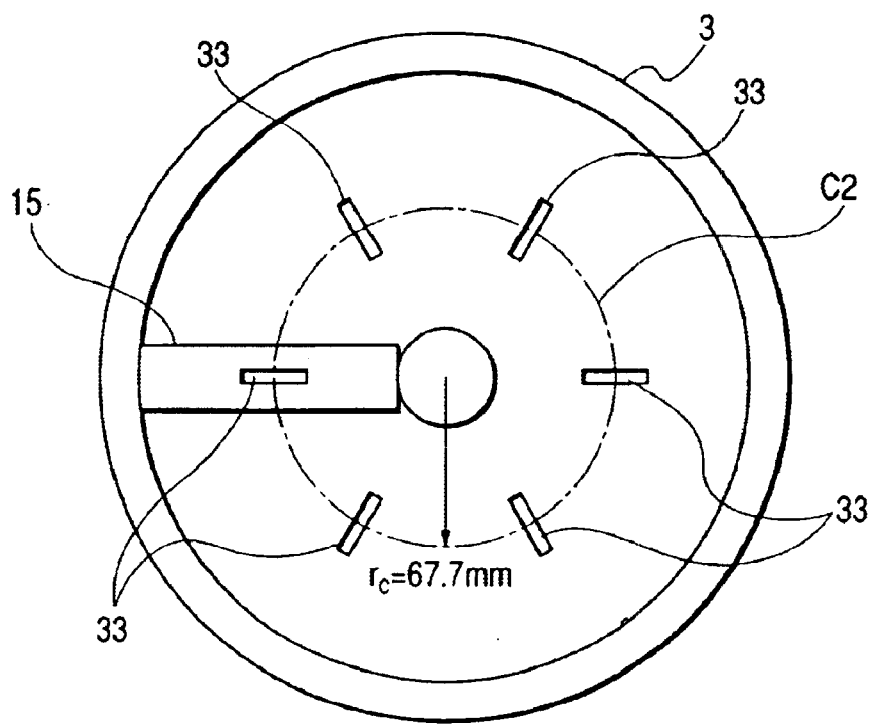
FIG. 19 is a schematic view of another microwave applicator used in the present invention.

The microwave plasma processing apparatus with the microwave applicator shown in FIG. 19 was used to generate a plasma under the conditions of an Ar flow rate of 500 sccm, a pressure of 1.33 Pa, and a microwave power of 3.0 kW, and the plasma obtained was measured. The plasma was measured as follows using a single probe method. The voltage applied to the probe was varied within the range of −50 V to +100 V, and a current flowing through the probe was measured by an I-V measuring device, and the electron density, the electron temperature and the plasma potential were calculated from the thus obtained I-V curve by the Langmuir method. As a result, the electron density was $1.9 \times 10^{12}/cm^3 \pm 3.1\%$ (within $\phi$ 300 plane) at 1.33 Pa, and it was confirmed that a high electron density, stable plasma was formed even in a low pressure region.

(Embodiment 10)

A microwave applicator of the microwave plasma processing apparatus in accordance with a tenth embodiment of the present invention will be described with reference to FIG. 20 in which the (waveguide circumferential length)/(guide wavelength) ratio $n^g$ is 4, the interslot surface standing wave antinode number $n^1$ is 3 and 5, and the material of the dielectric window is aluminium nitride (dielectric constant $\in_w$: 9.8). The configuration of the apparatus body is similar to that shown in FIGS. 16A to 16C.

In the present embodiment, the slots 33 are formed linearly and discontinuously in pairs such that the centers of the inner slots are on a circle C2 with a radius $r_c$ of about 82.9 mm inside the center line of the microwave waveguide 13 of the endless circular waveguide and the centers of the outer slots are on a circle C5 with a radius $r_c$ of about 127.2 mm outside the center line of the microwave waveguide 13, respectively. The radii $r_c$ of the circles C2 and C5 each satisfies the above mentioned equality.

With the apparatus of the above mentioned configuration, microwaves of $TE_{10}$ mode introduced into the endless circular waveguide 13 are distributed into two of the right and left at the E-junction and propagate within the waveguide 13 at a guide wavelength longer than the wavelength in the free space.

The distributed microwaves interfere with each other to generate standing waves STW at every ½ of the guide wavelength in the waveguide. Microwaves introduced into the plasma processing chamber 9 through the dielectric window 4 from the slots 33 provided at such positions as to maximize the current, i.e., at the centers between adjoining two standing waves generate a plasma in the vicinity of the slots 33. When the electron plasma frequency of the generated plasma exceeds the power source frequency (for example, when the electron plasma frequency exceeds the power source frequency of 2.45 GHz in the case where the electron density exceeds $7 \times 10^{10}$ cm$^{-3}$), the so-called cut-off in which microwaves can not propagate through the plasma is caused. Further, when the electron density increases and the skin depth $\delta$ defined by $$\delta = (2/\omega \mu_o \sigma)^{1/2}$$

(wherein, $\omega$ is the angular frequency of a power source, $\mu_o$ is the space permeability, and $\sigma$ is the plasma conductivity) becomes sufficiently small (for example, when the electron density becomes $2 \times 10^{12}$ cm$^{-3}$ or more, the skin depth becomes 4 mm or less), the microwaves propagate as the surface waves SW in the surface of the dielectric window 4.

Surface waves SW introduced via adjoining slots 33 interfere with each other to generate surface standing waves SSTW at about every 20 mm. The surface standing waves SSTW leaked to the plasma processing chamber accelerate electrons, thus generating a surface-wave interfered plasma SIP.

The dielectric window 4 of aluminium nitride has a diameter 350 mm and a thickness 13 mm. The endless circular waveguide has a 9 mm×96 mm inner wall cross section and a central diameter of about 202 mm (the circumferential length $1_g$ of the waveguide being four times the guide wavelength $\lambda_g$). As the material of the endless circular waveguide 3, Al is used entirely in order to suppress the propagation loss of microwaves. In the H-plane of the endless circular waveguide 3, are formed slots 33 for introducing microwaves into the plasma processing chamber 9. The slots 33 having their centers on the inner circle C2 with the radius 82.9 mm each have a rectangular shape of 40 mm in length and 4 mm in width and the slots 33 having their centers on the outer circle C5 with the radius 127.2 mm each have a rectangular shape of 46 mm in length and 4 mm in width, and eight pairs of slots are formed radially in the total number of 16 at an interval of 45°. To the endless circular waveguide, are connected a 4E tuner, a directional coupler, an isolator, and a microwave power source (not shown) of frequency 2.45 GHz in this order.

Figure 20:
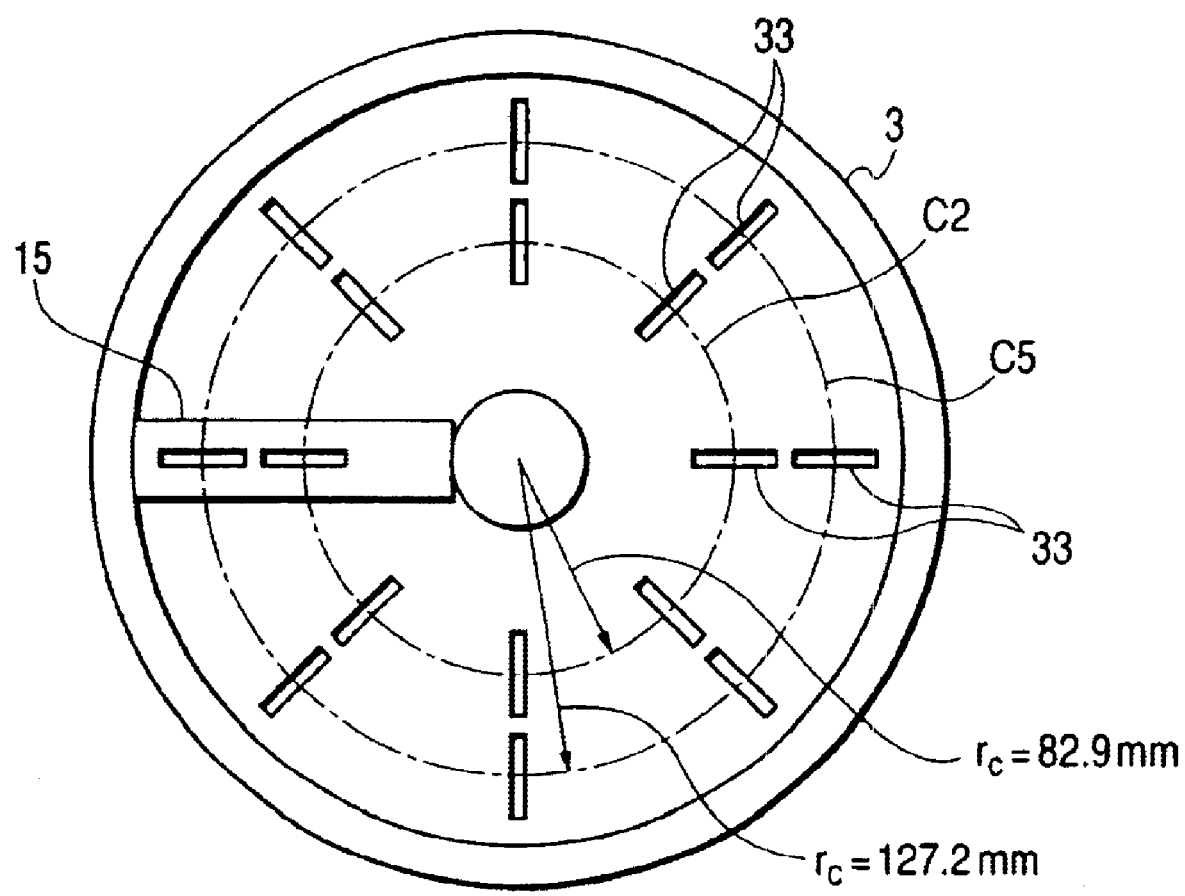
FIG. 20 is a schematic view of another microwave applicator used in the present invention.

The microwave plasma processing apparatus with the microwave applicator shown in FIG. 20 was used to generate a plasma under the conditions of an Ar flow rate of 500 sccm, a pressure of 1.33 Pa, and a microwave power of 3.0 kW, and the plasma obtained was measured. The plasma was measured as follows using a single probe method. The voltage applied to the probe was varied within the range of −50 V to +100 V, and a current flowing through the probe was measured by an I-V measuring device, and the electron density, the electron temperature and the plasma potential were calculated from the thus obtained I-V curve by the Langmuir method. As a result, the electron density was $1.9 \times 10^{12}/cm^3 \pm 2.2\%$ (within $\phi$ 300 plane) at 1.33 Pa, and it was confirmed that a high electron density, stable plasma was formed even in a low pressure region.

As described above, the shape of the circular waveguide used in the present invention is not limited to a circular ring but may be an ellipsoidal, square, pentagonal ring, or the like, as long as it is circular (or annular).

When a disk-like article such as a semiconductor wafer, optical disk, magnetic disk, or the like is to be processed, a circular ring shape is preferable.

As the microwave applicator with a circular waveguide used in the present invention, it is also preferable to use an assembly of a conductive base member having a circular recess for forming a waveguide and a slotted flat plate.

It is also preferred that the inside of the waveguide is filled with a dielectric to reduce the guide wavelength as the occasion demands. As such a dielectric, a resin such as tetrafluoroethylene, etc. is preferably used.

The offset amount of the slots used in the present invention is suitably determined depending on the processing conditions used as described in Embodiments 7 to 10. Especially, when the slotted flat plate 23 is configured to be interchangeable, it is possible to flexibly attend to a change in processing conditions.

The shape of the heterocentral slot used in the present invention in which the center of the slot is different from the center of the circular waveguide may be a single rectangle perforation, or may alternatively be a combination of plural perforations having a length of ¼ to ⅜ of the guide wavelength and arranged discontinuously along a line, as long as the center of each slot is offset inside or outside with regard to the center line of the waveguide as described above.

As the material of the slotted flat plate and circular waveguide used in the present invention, any conductor may be used, but an optimal material is stainless steel plated with Al, Cu, or Ag/Cu that has a high conductivity in order to minimize the propagation loss of microwaves.

The direction of introducing microwaves into the circular waveguide used in the present invention may be a direction in which microwaves can be introduced parallel to the H-plane such as H-plane T junction or tangential introduction, or a direction in which microwaves can be introduced perpendicularly to the H-plane such as E-plane T junction, as long as it can efficiently introduce microwaves into the microwave propagating space in the circular waveguide. Further, a distributor such as shown by reference numeral 10 in FIG. 15 may be provided near the introduction port. The slot interval in the microwave travelling direction used in the present invention is optimally ½ or ¼ of the guide wavelength.

The microwave frequency used in the present invention may suitably be selected within the range of 0.8 GHz to 20 GHz.

As the dielectric of the microwave transmissive window used in the present invention, there can preferably be included quartz glass and other $SiO_2$-based glass, inorganic substances such as $Si_3N_4$, NaCl, KCl, LiF, $CaF_2$, $BaF_2$, $Al_2O_3$, AlN, MgO, etc., but films or sheets of organic substances such as polyethylene, polyester, polycarbonate, cellulose acetate, polypropylene, polyvinyl chloride, polyvinylidene chloride, polystyrene, polyamide, polyimide, etc. are also applicable.

In the present microwave plasma processing apparatus and method, a magnetic field generating means may be used. As the magnetic field used in the present invention, although the mirror magnetic field is applicable, the magnetron magnetic field is optimal which provides a larger magnetic flux density in a magnetic field in the vicinity of the slots than in a magnetic field in the vicinity of the article. As the magnetic field generating means other than coils, permanent magnets may be used. When a coil is used, another cooling means such as a water- or air-cooling mechanism may be used to prevent overheating.

In addition, in order to further improve the quality of the processing, a surface of the article may be irradiated with ultraviolet light. As the light source, it is possible to use those which radiate a light that is absorbed by the article or the gas adhering thereto, and it is appropriate to use excimer lasers and lamps, rare gas resonance line lamps, low-pressure mercury lamps, and the like.

The pressure inside the plasma generation chamber 9 of the present invention may be selected within the range of $1.33 \times 10^{-2}$ Pa to $1.33 \times 10^3$ Pa, and more preferably $1.33 \times 10^{-1}$ Pa to $1.33 \times 10$ Pa in the case of CVD, $6.65 \times 10^{-2}$ Pa to 6.65 Pa in the case of etching, and $1.33 \times 10$ Pa to $1.33 \times 10^3$ Pa in the case of ashing.

The plasma processing method according to the present invention is described with reference to FIGS. 10A to 10E.

Figure 10A:
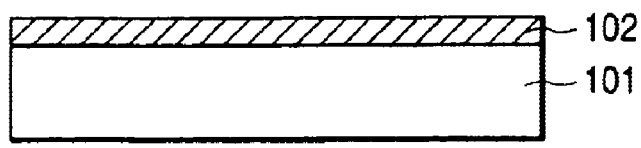
FIGS. 10A, 10B, 10C, 10D, and 10E are schematic views showing an example of a plasma processing method.

As shown in FIG. 10A, on a surface of an article 101 such as a silicon substrate, is formed by a CVD apparatus or surface modifying apparatus an insulating film 102 made of an inorganic substance such as silicon oxide, silicon nitride, silicon oxynitride, aluminium oxide, tantalum oxide, etc. or an organic substance such as tetrafluoroethylene, polyarylether, etc.

Figure 10B:
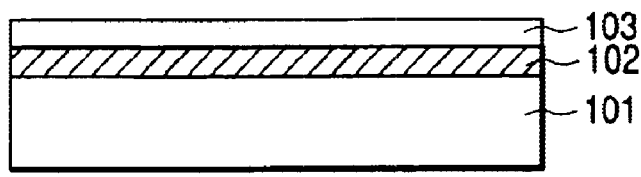

As shown in FIG. 10B, a photo resist is applied thereon and baking is carried out to form a photo resist layer 103.

Figure 10C:
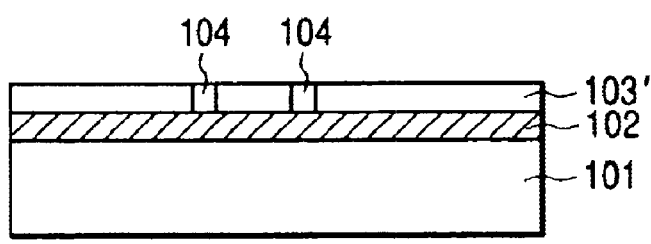

As shown in FIG. 10C, a hole pattern latent image is formed by an aligner and developed to form a photo resist pattern 103' with holes 104.

Figure 10D:
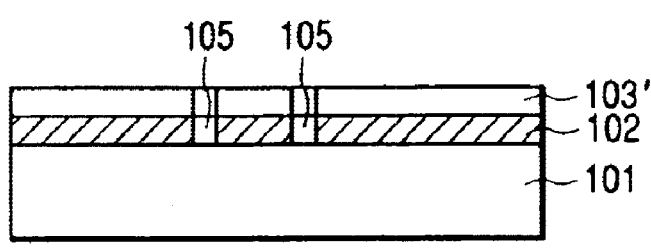

As shown in FIG. 10D, the insulating film 102 under the photo resist pattern 103' is etched by an etching apparatus to form holes 105.

Figure 10E:
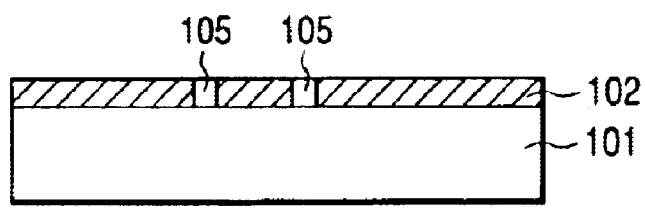

As shown in FIG. 10E, the photo resist pattern 103' is ashed by use of an ashing apparatus to be removed.

Thus, a structure with a holed insulating film is obtained.

When a conductor or the like is further deposited in the holes, it is preferred that the inside of the holes is previously cleaned by a cleaning apparatus or the like.

Further, the plasma processing apparatuses according to the present invention described above by referring to FIGS. 1 to 9, 16A to 16C, and 18 to 20 are available as at least one of the CVD apparatus, surface modifying apparatus, etching apparatus and ashing apparatus used in the above mentioned steps.

Figure 11A:
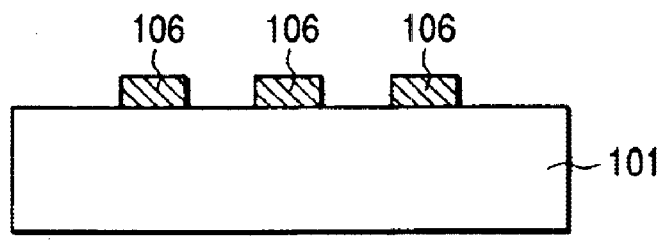
FIGS. 11A, 11B, and 11C are schematic views showing another example of a plasma processing method.
Figure 11B:
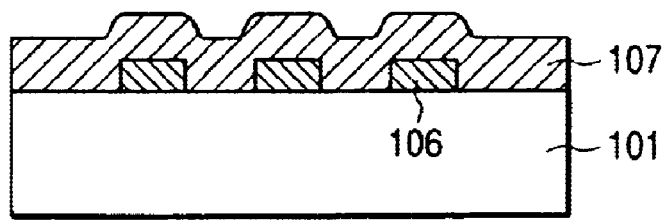
Figure 11C:
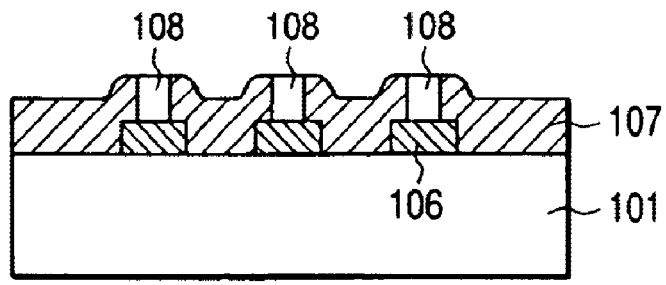
Figure 12:
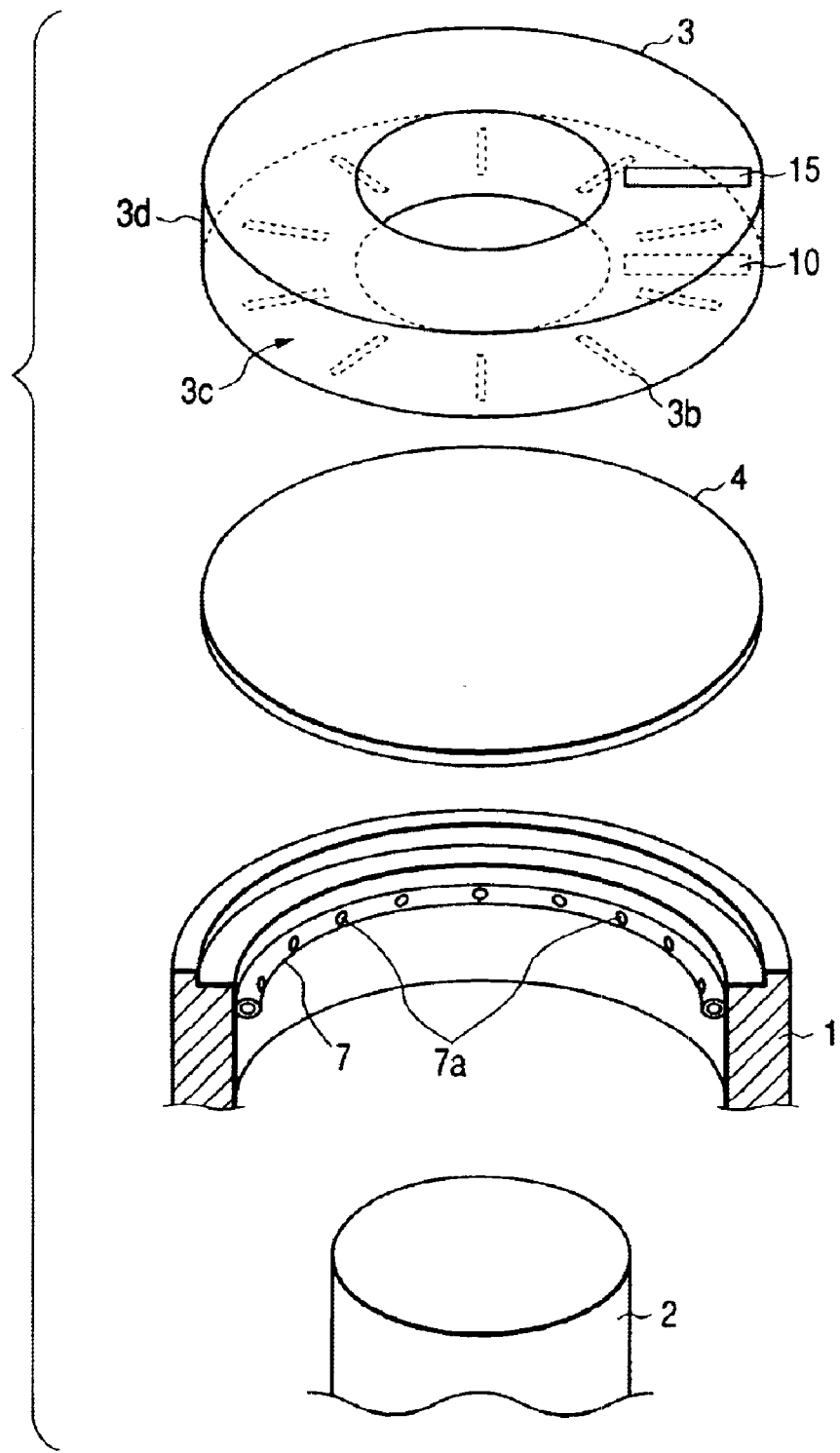
FIG. 12 is a schematic view showing the configuration of a plasma processing apparatus.
Figure 13:
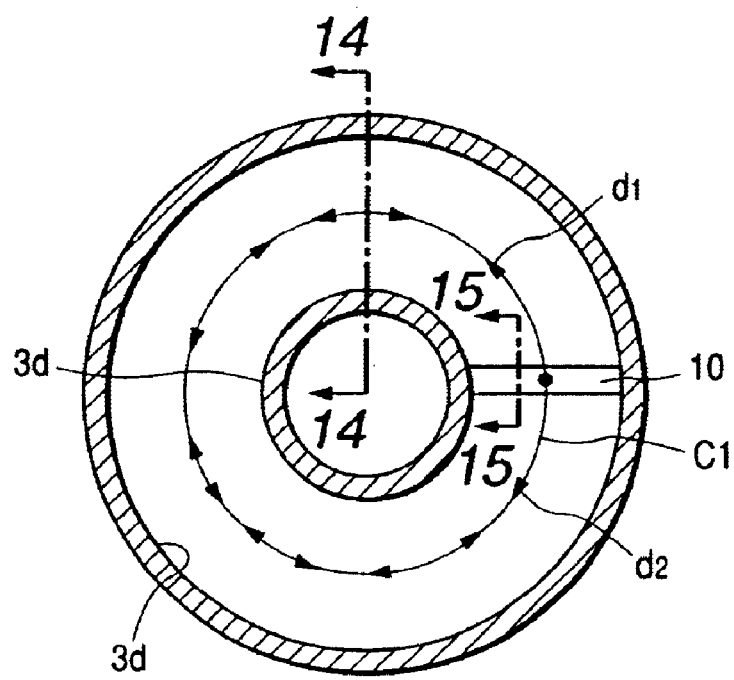
FIG. 13 is a schematic sectional view of a microwave applicator.

FIGS. 11A to 11C illustrates another plasma processing method according to the present invention.

As shown in FIG. 11A, there is formed a pattern (here, line and space) of a conductor comprised of a metal such as aluminium, copper, molybdenum, chromium, or tungsten, or an alloy containing at least one of the metals as a main component or polycrystal silicon is formed.

As shown in FIG. 11B, an insulating film 107 is formed by a CVD apparatus or the like.

After a photo resist pattern (not shown) is formed, holes 108 are formed in the insulating film 107 by an etching apparatus.

The photo resist pattern is removed by an ashing apparatus or the like to provide a structure as shown in FIG. 11C.

Further, the plasma processing apparatus of the present invention can be used as the above mentioned CVD apparatus, etching apparatus and ashing apparatus, but is not limitedly applied thereto as described below.

In formation of a deposited film according to the present microwave plasma processing method, suitable selection of the gases used enables efficient formation of various deposited films such as an insulating film of $Si_3N_4$, $SiO_2$, $Ta_2O_5$, $TiO_2$, TiN, $Al_2O_3$, AlN, $MgF_2$, $AlF_3$, fluorocarbons, etc.; a semiconductor film of a-Si (amorphous silicon), poly-Si (polysilicon), SiC, GaAs, etc.; and a metal film of Al, W, Mo, Ti, Ta, etc.; amorphous carbon, diamond-like carbon, diamond, or the like.

The base member (substrate) of an article processed by the present plasma processing method may be semiconducting, conductive or insulating. Specific examples thereof include semiconductor substrates such as an Si wafer, SOI wafer, or the like.

As the conductive substrate, there can be included metals such as Fe, Ni, Cr, Al, Mo, Au, Nb, Ta, V, Ti, Pt, Pb, etc., and alloys thereof such as brass, stainless steel, etc.

As the insulating substrate, there can be included quartz glass and other glasses; inorganic substances such as $Si_3N_4$, NaCl, KCl, LiF, $CaF_2$, $BaF_2$, $Al_2O_3$, AlN, MgO, etc.; and films or sheets of organic substances such as polyethylene, polyester, polycarbonate, cellulose acetate, polypropylene, polyvinyl chloride, polyvinylidene chloride, polystyrene, polyamide, polyimide, etc.

As the gases used in the case of forming a thin film on a substrate by the CVD process, generally known gases can be used.

Specifically, when a thin film of an Si-based semiconductor such as a-Si, poly-Si, or SiC is to be formed, there can be included those which are in a gaseous state at ordinary temperature and pressure or which are gassified easily, for example, inorganic silanes such as $SiH_4$ or $Si_2H_6$; organic silanes such as tetraethylsilane (TES), tetramethylsilane (TMS), dimethylsilane (DMS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, or $SiCl_2F_2$. In addition, as an additional gas or a carrier gas that may be mixed with the Si material gas and introduced, there may be included $H_2$, He, Ne, Ar, Kr, Xe, and Rn.

As the material containing Si atoms used for formation of a thin film based on an Si compound such as $Si_3N_4$ or $SiO_2$, the following materials that maintain a gaseous state at ordinary temperature and pressure or that are gassified easily using a vaporizer or a bubbler can be used: inorganic silanes such as $SiH_4$ or $Si_2H_6$; organic silanes such as tetraetoxysilane (TEOS), tetrametoxysilane (TMOS), octamethylcyclotetrasilane (OMCTS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, or $SiCl_2F_2$. In addition, as a nitrogen or an oxygen material gas that may be simultaneously introduced, there can be included $N_2$, $NH_3$, $N_2H_4$, hexamethyldisilazane (HMDS), $O_2$, $O_3$, $H_2O$, NO, $N_2O$, $NO_2$, and so on.

The material containing metal atoms which is used to form a thin metal film such as of Al, W, Mo, Ti, Ta, or the like includes organic metals such as trimethyl aluminium (TMAl), triethyl aluminium (TEAl), triisobutyl aluminium (TIBAl), dimethyl aluminium hydride (DMAlH), tungsten carbonyl $(W(CO)_6)$, molybdenum carbonyl $(Mo(CO)_6)$, trimethyl gallium (TMGa), and triethyl gallium (TEGa); and halogenated metals such as $AlCl_3$, $WF_6$, $TiCl_3$, and $TaCl_5$. In this case, as an additional or carrier gas which may be mixed with the above Si material gas, $H_2$, He, Ne, Ar, Kr, Xe, Rn, and so on may be included.

The material containing metal atoms which is used to form a thin metal compound film such as of $Al_2O_3$, AlN, $Ta_2O_5$, $TiO_2$, TiN, $WO_3$, or the like includes organic metals such as trimethyl aluminium (TMAl), triethyl aluminium (TEAl), triisobutyl aluminium (TIBAl), dimethyl aluminium hydride (DMAlH), tungsten carbonyl $(W(CO)_6)$, molybdenum carbonyl $(Mo(CO)_6)$, trimethyl gallium (TMGa), and triethyl gallium (TEGa); and halogenated metals such as $AlCl_3$, $WF_6$, $TiCl_3$, and $TaCl_5$. In this case, as an oxygen or a nitrogen material gas that may be simultaneously introduced includes $O_2$, $O_3$, $H_2O$, NO, $N_2O$, $NO_2$, $N_2$, $NH_3$, $N_2H_4$, and hexamethyldisilazane (HMDS).

When a carbon film such as of amorphous carbon, diamond-like carbon, diamond, or the like is to be formed, a carbon-containing gas such as $CH_4$, $C_2H_6$, etc. may preferably be used.

When a fluorocarbon film is to be formed, a fluorine and carbon-containing gas such as $CF_4$, $C_2F_6$, etc. may preferably be used.

As the etching gas for etching a surface of a substrate, there may be included $F_2$, $CF_4$, $CH_2F_2$, $C_2F_6$, $C_4F_8$, $CF_2Cl_2$, $SF_6$, $NF_3$, $Cl_2$, $CCl_4$, $CH_2Cl_2$, $C_2Cl_6$, or the like.

As the ashing gas for ashing and removing organic components on a surface of a substrate such as a photo resist, there may be included $O_2$, $O_3$, $H_2O$, $N_2$, NO, $N_2O$, $NO_2$, and so on.

Further, in the case of the cleaning, the etching or ashing gas listed above, or hydrogen gas or an inactive gas may be used.

In addition, when the present microwave plasma processing apparatus and method is applied to surface modification, appropriate selection of the gas used enables the oxidation or nitridation treatment of a substrate or a surface layer consisting of, e.g., Si, Al, Ti, Zn, or Ta or the doping treatment with B, As, or P. Furthermore, the present invention can be applied to the cleaning process. In this case, it can be used to cleaning of oxides, organic substances, or heavy metals.

As the oxidizing gas used for surface treatment by oxidation of a substrate, there may be included $O_2$, $O_3$, $H_2O$, NO, $N_2O$, $NO_2$, or the like. In addition, the nitriding gas used for surface treatment by nitridation of a substrate includes $N_2$, $NH_3$, $N_2H_4$, and hexamethyldisilazane (HMDS).

As a cleaning/ashing gas used when an organic substance on the surface of a substrate is cleaned or when an organic component on the surface of a substrate, such as a photo resist is removed by ashing, $O_2$, $O_3$, $H_2O$, $H_2$, NO, $N_2O$, $N_2$, or the like may be included. In addition, as a cleaning gas used when an inorganic substance on the surface of a substrate is cleaned, $F_2$, $CF_4$, $CH_2F_2$, $C_2F_6$, $C_4F_8$, $CF_2Cl_2$, $SF_6$, $NF_3$, or the like may be included.

The present invention is specifically described below with reference to examples, but the present invention is not limited to these examples.

EXAMPLE 1

In this example, an apparatus with the configuration such as shown in FIGS. 1 and 2 was produced and a plasma was generated therein.

In an aluminium conductive member, was formed a circular groove which forms an endless circular waveguide 13. The endless circular waveguide has a rectangular section of 27 mm in height and 96 mm in width as a section perpendicular to the microwave travelling direction, and having a circumferential length three times the guide wavelength and a central diameter of 152 mm.

In a conductive flat plate, were formed six rectangular slots of 42 mm in length and 4 mm in width at an interval of ½ of the guide length to produce a slotted flat plate 23 made of aluminium. At this time, the centers of the slots were offset inside by 24 mm with regard to the center line of the waveguide 13.

The conductive member and the slotted flat plate were assembled into a microwave applicator such as shown in FIG. 1.

Anhydrous synthetic quartz glass was worked to form a disc with a diameter 299 mm and a thickness 12 mm to be used as the dielectric window 4.

For the purpose of experiment, a probe was arranged in the space 9, then the inside of the space 9 was exhausted, and argon gas was introduced at 500 sccm through the gas supply passage 7.

The conductance valve of the exhaust system and the mass flow controller of the gas supply system were adjusted to maintain the pressure inside the space 9 at 1.33 Pa.

Microwaves of 2.45 GHz and 3.0 kW was introduced in the $TE_{10}$- mode into the microwave applicator 3 through the waveguide 13 via a 4E tuner, a directional coupler and an isolator.

Using a single probe method, the voltage applied to the probe was varied within a range of −50 V to +100 V, while the current flowing through the probe was measured, thus obtaining an I-V curve and calculate the electron density. As a result, the electron density was $2.1 \times 10^{12}/cm^3$ within a plane of 300 in diameter with the uniformity of the electron density (represented by dispersion) being ±2.7%.

Next, when the pressure was raised to 133 Pa and the electron density was measured in the same manner as above, it was $9.6 \times 10^{11}/cm^3$ with the uniformity of the electron density being ±5.4%.

From the above, it was confirmed that a high density plasma was formed near the lateral center of the space 9 even in a high pressure region.

EXAMPLE 2

In this example, an apparatus with the configuration such as shown in FIGS. 3 and 4 was produced and a plasma was generated therein.

The slotted flat plate used in Example 1 was replaced with a flat plate such as shown in FIG. 4.

In an aluminium flat plate, were formed at the inside positions six rectangular slots of 42 mm in length and 4 mm in width at an equal interval. The offset amount was 23 mm.

Further, there were formed at the outside positions six rectangular slots of 42 mm in length and 4 mm in width at an equal interval. The offset amount was 23 mm.

Thus, there were formed six pairs of discontinuous linear slots at an interval of one half of the guide wavelength.

The interval between a pair of slots on the same line was 4 mm and the angle formed by adjacent discontinuous linear slots was 60°.

Further, anhydrous synthetic quartz glass was worked to form the disc-like dielectric window 4 with a diameter 299 mm and a thickness 16 mm.

The procedure of Example 1 was followed to calculate the electron density of a plasma.

When the pressure was 1.33 Pa, the electron density was $1.9 \times 10^{12}/cm^3$ with the uniformity ±2.7%.

When the pressure was 133 Pa, the electron density was $8.7 \times 10^{11}/cm^3$ with the uniformity ±5.6%.

EXAMPLE 3

The microwave plasma processing apparatus shown in FIGS. 1 and 2 was used to carry out ashing of a photo resist by the following procedure.

As the article W, was used a silicon substrate (200 mm in diameter) immediately after an insulating film of silicon oxide under a photo resist pattern was etched to form via holes. First, the Si substrate was put on the holding means 2, and the inside of the container 1 was evacuated via the exhaust system to reduce the pressure down to $1.33 \times 10^{-3}$ Pa. Oxygen gas was introduced at a flow rate of 2 slm into the container 1 via the processing gas supply port 17. Then, the conductance valve 28 provided in the exhaust system was adjusted to maintain the inside of the container 1 at 133 Pa. A power of 1.5 kW and 2.45 GHz from the microwave power source 6 was supplied into the container 1 through the microwave applicator 3 to generate a plasma in the space 9. At this time, the oxygen gas introduced via the processing gas supply port 17 was converted to ozone in the space 9, which was then transported toward the Si substrate W to oxidize the photo resist on the substrate, thus vaporizing the photo resist to be removed. After ashing, the ashing speed and the charge density on the surface of the substrate were evaluated.

The ashing speed and uniformity obtained was as very high as 6.6 μm/min ±4.5%, and the surface charge density was as sufficiently low as $-1.3 \times 10^{11}/cm^2$.

EXAMPLE 4

The microwave plasma processing apparatus shown in FIGS. 3 and 4 was used to carry out ashing of a photo resist.

The article used and the processing procedure are the same as in Example 3.

The ashing speed and uniformity obtained was 6.4 μm/min±3.4%, and the surface charge density was as sufficiently low as $-1.4 \times 10^{11}/cm^2$.

EXAMPLE 5

The microwave plasma processing apparatus shown in FIGS. 1 and 2 was used to form a silicon nitride film serving to protect a semiconductor element by the following procedure.

The article W was a P-type single crystal silicon substrate (face orientation <100>; resistivity: 10 Ωcm) with an insulation film comprised of silicon oxide on which an Al wiring pattern with line and space each of 0.5 μm was formed. First, the silicon substrate was put on the holding means 2, and the inside of the container 1 was then evacuated via the exhaust system to reduce the pressure down to $1.33 \times 10^{-5}$ Pa. Subsequently, a heater (not shown) provided in the holding means 2 was energized to heat the silicon substrate to 300° C., and the substrate was maintained at this temperature. Nitrogen gas at a flow rate of 600 sccm and monosilane gas at a flow rate of 200 sccm were introduced into the container 1 via the processing gas supply port 17. Then, the conductance valve 28 provided in the exhaust system was adjusted to maintain the inside of the container 1 at 2.66 Pa. Subsequently, a power of 3.0 kW and 2.45 GHz from the microwave power source 6 was introduced via the microwave applicator 3. Thus, a plasma was generated in the space 9. At this time, the nitrogen gas introduced via the processing gas supply port 17 was excited, decomposed or ionized in the space 9 to form an active species, which was then transported toward the silicon substrate to react with the monosilane gas, thereby forming a silicon nitride film in 1.0 μm thickness on the silicon substrate. The film formation speed and the film quality such as stress were evaluated. For the stress, the change in the amount of the warpage of the substrate was measured before and after the film formation using a laser interferometer Zygo (trade name).

The formation speed and uniformity of the silicon nitride film obtained was 510 nm/min±2.5, and the stress was $1.2 \times 10^9$ dyne/cm² (compression), the leak current was $1.2 \times 10^{-10}$ A/cm², and the dielectric strength was 9 MV/cm, and the film was therefore confirmed to be very excellent.

EXAMPLE 6

The microwave plasma processing apparatus shown in FIGS. 3 and 4 was used to form a silicon oxide and a silicon nitride films serving as an anti-reflection film for a plastic lens by the following procedure.

The article W was a plastic convex lens of a diameter 50 mm. First, the lens was put on the holding means 2, and the inside of the container 1 was evacuated via the exhaust system to reduce the pressure down to $1.33 \times 10^{-5}$ Pa. Nitrogen gas at a flow rate of 160 sccm and monosilane gas at a flow rate of 100 sccm were introduced into the container 1 via the processing gas supply port 17. Then, the conductance valve 28 provided in the exhaust system was adjusted to maintain the inside of the container 1 at $9.32 \times 10^{-1}$ Pa. Subsequently, a power of 3.0 kW and 2.45 GHz from the microwave power source 6 was supplied into the container 1 through the microwave applicator 3 to generate a plasma in the space 9. At this time, the nitrogen gas introduced via the processing gas supply port 17 was excited, decomposed or ionized in the space to form an active species such as nitrogen atoms, which was then transported toward the lens to react with the monosilane gas, thereby forming a silicon nitride film in a 21 nm thickness on the surface of the lens.

Next, oxygen gas at a flow rate of 200 sccm and monosilane gas at a flow rate of 100 sccm were introduced into the container 1 via the processing gas supply port 17. Then, the conductance valve 28 provided in the exhaust system was adjusted to maintain the inside of the container 1 at $1.33 \times 10^{-1}$ Pa. Subsequently, a power of 2.0 kW and 2.45 GHz from the microwave power source 6 was supplied into the container 1 through the microwave applicator 3 to generate a plasma in the space 9. At this time, the thus introduced oxygen gas was excited and decomposed in the space 9 to form an active species such as oxygen atoms, which was then transported toward the lens to react with the monosilane gas, thereby forming a silicon oxide film in a 86 nm thickness on the lens. The film formation speed and the reflection characteristic were evaluated.

The formation speeds and uniformities of the silicon nitride and silicon oxide films as obtained were 320 nm/min±2.2% and 350 nm/min±2.6%, respectively, and the reflectance in the vicinity of 500 nm was 0.3%, and the film was thus confirmed to have very excellent optical characteristics.

EXAMPLE 7

The microwave plasma processing apparatus shown in FIGS. 3 and 4 was used to form a layer insulation film of a semiconductor element by the following procedure.

The article W was a P-type single crystal silicon substrate (face orientation <100>; resistivity: 10 Ωcm) having formed on the top portion an Al pattern of line and space of 0.5 μm each. First, the silicon substrate was put on the holding means 2. The inside of the container 1 was then evacuated via the exhaust system to reduce the pressure down to $1.33 \times 10^{-5}$ Pa. Subsequently, a heater provided in the holding means was energized to heat the silicon substrate to 300° C., and the substrate was maintained at this temperature. Oxygen gas at a flow rate of 500 sccm and monosilane gas at a flow rate of 200 sccm were introduced into the container 1 via the processing gas supply port 17. Then, the conductance valve 28 provided in the exhaust system was adjusted to maintain the inside of the container 1 at 4.00 Pa. Subsequently, a high-frequency power of 300 W and 13.56 MHz was applied to the holding means 2 via the bias voltage application means provided in the holding means, while a power of 2.0 kW and 2.45 GHz from the microwave power source 6 was supplied into the container 1 through the microwave applicator 3, thus generating a plasma in the space 9. The oxygen gas introduced via the processing gas supply port 17 was excited and decomposed in the space 9 to form an active species, which was then transported toward the silicon substrate to react with the monosilane gas, thereby forming a silicon oxide film in a 0.8 μm thickness on the silicon substrate. At this time, ion species were accelerated by the RF bias to be incident to the substrate and to cut the silicon oxide film on the Al pattern, thereby improving the flatness. Then, the film formation speed, uniformity, dielectric strength, and step coverage were evaluated. The step coverage was evaluated by observing a cross section of the silicon oxide film formed on the Al pattern with a scanning electron microscope (SEM) to check presence of voids.

The formation speed and uniformity of the silicon oxide film thus obtained was 240 nm/min±2.5%, and the dielectric strength was 8.5 MV/cm and no voids were found. Therefore, the film was confirmed to be excellent.

EXAMPLE 8

The microwave plasma processing apparatus shown in FIGS. 3 and 4 was used to etch a layer insulation film of a semiconductor element by the following procedure.

The article W was a P-type single crystal silicon substrate (face orientation <100>; resistivity: 10 Ωcm) having formed on an Al pattern of line and space of 0.18 μm an insulating film comprised of silicon oxide in 1 μm thickness and a photo resist pattern further thereon. First, after the silicon substrate was put on the holding means 2, the inside of the container 1 was evacuated via the exhaust system to reduce the pressure down to $1.33 \times 10^{-5}$ Pa. $C_4F_8$ gas at a flow rate of 100 sccm was introduced into the container 1 via the processing gas supply port 17. Then, the conductance valve 28 provided in the exhaust system was adjusted to maintain the inside of the container 1 at 1.33 Pa. Subsequently, a high-frequency power of 300 W and 13.56 MHz was applied to the holding means 2 via the bias voltage application means provided in the holding means, while a power of 2.0 kW and 2.45 GHz from the microwave power source 6 was supplied into the container 1 through the microwave applicator 3, thus generating a plasma in the space 9. The $C_4F_8$ gas introduced into the container 1 via the processing gas supply port 17 was excited and decomposed in the space 9 to form an active species, which was then transported toward the silicon substrate, where ions accelerated by a self bias etched the silicon oxide insulating film to form holes. A cooler (not shown) provided in the holding means 2 prevented the temperature of the substrate from increasing above 80° C. After etching, the etch rate, etch selectivity, and etched shape were evaluated. The etched shape was evaluated by using a scanning electron microscope (SEM) to observe a cross section of the etched silicon oxide film.

The etch rate and uniformity and the etch selectivity to polysilicon were 540 nm/min±2.2% and 20, respectively, and it was confirmed that the holes showed almost vertical side surfaces, and that the microloading effect was small.

EXAMPLE 9

The plasma processing apparatus shown in FIGS. 3 and 4 was used to ash a photo resist on a wafer of 200 in diameter.

As the microwave applicator, there was used one having such a configuration that the circumferential length was twice the guide length, and that four pairs of discontinuous linear slots were formed at an interval of one half of the guide wavelength.

EXAMPLE 10

The plasma processing apparatus shown in FIGS. 3 and 4 was used to etch an insulation film comprised of silicon oxide on a surface of a wafer of 300 mm in diameter.

As the microwave applicator, there was used one having such a configuration that the circumferential length was 4 times the guide length, and that eight pairs of discontinuous linear slots were formed at an interval of one half of the guide wavelength.

EXAMPLE 11

The microwave plasma processing apparatus shown in FIGS. 5 and 6 was used to carry out ashing of a photo resist by the following procedure.

As the article W, was used a silicon substrate (φ8 inches) immediately after a layer insulating $SiO_2$ film was etched to form via holes. First, the Si substrate was put on the holding means 2, and the inside of the container 1 was evacuated via the exhaust system (not shown) to reduce the pressure down to about $1.33 \times 10^{-3}$ Pa. Oxygen gas as the plasma processing gas was introduced at a flow rate of 2 slm into the container 1. Then, the conductance valve (not shown) provided in the exhaust system (not shown) was adjusted to maintain the inside of the container 1 at about $2.66 \times 10^2$ Pa. A power of 1.5 kW from a microwave power source of 2.45 GHz was supplied into the container 1 through the microwave applicator 3 to generate a plasma in the container 1. At this time, a part of the oxygen gas as introduced was converted to ozone in the container 1, which was then transported toward the silicon substrate to oxidize the photo resist on the silicon substrate, whereby the photo resist was vaporized to be removed. At this time, the ashing speed and the charge density on the surface of the substrate were evaluated.

The ashing speed obtained was as significantly high as 8.6 μm/min±8.5%, and the surface charge density was as sufficiently low as $-1.3 \times 10^{11}/cm^2$.

EXAMPLE 12

The microwave plasma processing apparatus shown in FIG. 7 was used to carry out ashing of a photo resist by the following procedure.

As the article W, was used a silicon substrate (φ8 inches) immediately after a layer insulating $SiO_2$ film was etched to form via holes. First, the Si substrate was put on the holding means 2, and the inside of the container 1 was evacuated to reduce the pressure down to about $1.33 \times 10^{-3}$ Pa. Oxygen gas was introduced at a flow rate of 2 slm into the container 1. Then, the inside of the container 1 was maintained at about $2.66 \times 10^2$ Pa. A power of 1.5 kW from a microwave power source of 2.45 GHz was supplied into the container 1 through the microwave applicator 3 to generate a plasma in the container 1. At this time, the oxygen gas as introduced was converted to ozone, which was then transported toward the substrate to oxidize the photo resist on the substrate, whereby the photo resist was vaporized to be removed. At this time, the ashing speed and the charge density on the surface of the substrate were evaluated.

The ashing speed obtained was as significantly high as 8.4 μm/min±7.4%, and the surface charge density was as sufficiently low as $-1.4 \times 10^{11}/cm^2$.

EXAMPLE 13

The microwave plasma processing apparatus shown in FIGS. 5 and 6 was used to form a silicon nitride film serving to protect a semiconductor element by the following procedure.

The article W was a P-type single crystal silicon substrate (face orientation <100>; resistivity: 10 Ωcm) with a layer insulation $SiO_2$ film on which an Al wiring pattern (line and space: 0.5 μm) was provided. First, the silicon substrate was put on the holding means 2, and the inside of the container 1 was then evacuated to reduce the pressure down to about $1.33 \times 10^{-5}$ Pa. Subsequently, the heater 114 was energized to heat the silicon substrate to 300° C., and the substrate was maintained at this temperature. Nitrogen gas at a flow rate of 600 sccm and monosilane gas at a flow rate of 200 sccm were introduced into the container 1, and the inside of the container 1 was maintained at about 2.66 Pa. Subsequently, a microwave power of 3.0 kW and 2.45 GHz was introduced into the container via the microwave applicator 3 to generated a plasma. At this time, the nitrogen gas formed active species, which was then transported toward the silicon substrate to react with the monosilane gas, thereby depositing a silicon nitride film in 1.0 μm thickness on the silicon substrate. As to the deposited film, the film formation speed and the film quality such as stress were evaluated. For the stress, the change in the amount of the warpage of the substrate was measured before and after the film formation using a laser interferometer Zygo (trade name).

The formation speed of the silicon nitride film obtained was as significantly high as 510 nm/min, and the stress was $1.2 \times 10^9$ dyne/$cm^2$ (compression), the leak current was $1.2 \times 10^{-10} A/cm^2$, and the dielectric strength was 9 MV/cm, and the film was therefore confirmed to be very excellent.

EXAMPLE 14

The microwave plasma processing apparatus shown in FIG. 7 was used to form a silicon oxide and a silicon nitride films serving as an anti-reflection film for a plastic lens by the following procedure.

The article W was a plastic convex lens of a diameter 50 mm. First, the lens was put on the holding means 2, and the inside of the container 1 was evacuated to reduce the pressure down to about $1.33 \times 10^{-5}$ Pa. Nitrogen gas at a flow rate of 160 sccm and monosilane gas at a flow rate of 100 sccm were introduced into the container 1, and the inside of the container 1 was maintained at about 0.93 Pa. Subsequently, a power of 3.0 kW and 2.45 GHz was supplied into the container 1 through the microwave applicator 3 to generate a plasma in the container 1. A silicon nitride film was formed in a 21 nm thickness on the lens.

Next, oxygen gas at a flow rate of 200 sccm and monosilane gas at a flow rate of 100 sccm were introduced into the container 1. Then, the inside of the container 1 was maintained at about 0.133 Pa. Subsequently, a power of 2.0 kW and 2.45 GHz was supplied into the container 1 to generate a plasma in the space 9. At this time, the thus introduced oxygen gas was excited and decomposed in the space 9 to form active species such as oxygen atoms or radicals, which was then transported toward the lens to react with the monosilane gas, thereby depositing a silicon oxide film in a 86 nm thickness on the lens.

The formation speeds and uniformities of the silicon nitride and silicon oxide films as obtained were as good as 320 nm/min and 350 nm/min, respectively, and the reflectance in the vicinity of 500 nm was 0.3%, and the film was thus confirmed to have very excellent reflectance characteristics.

EXAMPLE 15

The microwave plasma processing apparatus shown in FIG. 8 was used to form a silicon oxide film for layer insulation of a semiconductor element by the following procedure.

The article W was a P-type single crystal silicon substrate (face orientation <100>; resistivity: 10 Ωcm) having formed on the top portion an Al pattern (line and space: 0.5 μm). First, the silicon substrate was put on the holding means 2. The inside of the container 1 was then evacuated to reduce the pressure down to about $1.33 \times 10^{-5}$ Pa. Subsequently, the heater 114 was energized to heat the silicon substrate to 300° C., and the substrate was maintained at this temperature. Oxygen gas at a flow rate of 500 sccm and monosilane gas at a flow rate of 200 sccm were introduced into the container 1, and the inside of the container 1 was maintained at about 3.99 Pa. Subsequently, an RF power of 300 W and 13.56 MHz was applied to the holding means 2, while a power of 2.0 kW and 2.45 GHz was supplied into the container 1 through the microwave applicator 3, thus generating a plasma in the space 9. The oxygen gas as introduced was excited, decomposed or ionized to form an active species, which was then transported toward the silicon substrate to react with the monosilane gas, thereby depositing silicon oxide. In this example, the ion species has a function of being accelerated by the RF bias to be incident to the substrate and to cut the film on the pattern, thereby improving the flatness of the film. As to the silicon oxide film formed in a 0.8 µm thickness on the substrate, the film formation speed, uniformity, dielectric strength, and step coverage were evaluated. The step coverage was evaluated by observing a cross section of the silicon oxide film formed on the Al pattern with a scanning electron microscope (SEM) to check presence of voids.

The formation speed and uniformity of the silicon oxide film thus obtained was as good as 240 nm/min±2.5%, and the dielectric strength was 8.5 MV/cm and no voids were found. Therefore, the film was confirmed to be excellent.

EXAMPLE 16

The microwave plasma processing apparatus shown in FIG. 9 was used to etch a layer insulation $SiO_2$ film of a semiconductor element by the following procedure.

The article W was a P-type single crystal silicon substrate (face orientation <100>; resistivity: 10 Ωcm) having formed on an Al pattern (line and space: 0.35) an layer insulation $SiO_2$ film in 1 µm thickness. First, after the silicon substrate was put on the holding means 2, the inside of the container 1 was evacuated via an exhaust system (not shown) to reduce the pressure down to about $1.33×10^{-5}$ Pa. $C_4F_8$ gas at a flow rate of 100 sccm was introduced into the container 1, and the inside of the container 1 was maintained at 1.33 Pa. Subsequently, an RF power of 300 W and 13.56 MHz was applied to the holding means 2, while a microwave power of 2.0 kW and 2.45 GHz was supplied into the container 1 through the microwave applicator 3, thus generating a plasma in the space 9. The $C_4F_8$ gas as introduced was excited, decomposed or ionized in the space 9 to form an active species, which was then transported toward the silicon substrate, where ions accelerated by a self bias etched the layer insulation $SiO_2$ film. The cooler 414 prevented the temperature of the substrate from increasing above 80° C. In the etching, the etch rate, etch selectivity, and etched shape were evaluated. The etched shape was evaluated by using a scanning electron microscope (SEM) to observe a cross section of the etched silicon oxide film.

The etch rate and the etch selectivity to polysilicon were as good as 540 nm/min and 20, respectively, and it was confirmed that the etched shape was almost vertical, and that the microloading effect was small.

EXAMPLE 17

The microwave plasma processing apparatus shown in FIG. 9 was used to etch a polysilicon film for a gate electrode of a semiconductor element by the following procedure.

As the article W, was provided a P-type single crystal silicon substrate (face orientation <100>; resistivity: 10 Ωcm) having a polysilicon film formed on the top portion thereof. First, after the silicon substrate was put on the holding means 2, the inside of the container 1 was evacuated to reduce the pressure down to about $1.33×10^{-5}$ Pa. $C_4F_8$ gas at the flow rate of 100 sccm and oxygen at the flow rate of 20 sccm were introduced into the container 1, and the inside of the container 1 was maintained at about 0.67 Pa. Subsequently, a high-frequency power of 300 W and 4000 kHz was applied to the holding means 2, while a microwave power of 1.5 kW and 2.45 GHz was supplied into the container 1 through the microwave applicator 3, thus generating a plasma in the space 9. The $C_4F_8$ gas and oxygen as introduced were excited, decomposed or ionized in the space 9 to form an active species, which was then transported toward the silicon substrate, where ions accelerated by a self bias etched the polysilicon film. During the processing, the cooler 414 prevented the temperature of the substrate from increasing above 80° C. The etch rate, etch selectivity, and etched shape in the etching were evaluated. The etched shape was evaluated by using a scanning electron microscope (SEM) to observe a cross section of the etched polysilicon film.

The etch rate and the etch selectivity to $SiO_2$ were as good as 750 nm/min and 29, respectively, and it was confirmed that the etched shape was vertical, and that the microloading effect was small.

EXAMPLE 18

The microwave plasma processing apparatus with the microwave applicator shown in FIG. 18 was used to carry out ashing of a photoresist by the following procedure.

As the article W, was used a silicon (Si) substrate (φ 8 inches) immediately after an interlayer $SiO_2$ film was etched to form via holes.

First, after the Si substrate was put on the support means 2 and heated to 250° C. using a heater as the temperature adjusting means 114, the plasma processing chamber 9 was evacuated via the exhaust system (18, 28) to reduce the pressure down to $1.33×10^{-3}$ Pa. Oxygen gas was introduced at a flow rate of 500 sccm into the plasma generation chamber 9 via the plasma processing gas supply port 7.

Then, the conductance valve 28 provided between the plasma processing chamber and the exhaust means 18 was adjusted to maintain the inside of the plasma processing chamber 9 at 40 Pa. A power of 1.5 kW from the microwave power source MW of 2.45 GHz was supplied into the plasma processing chamber 9 through the endless circular waveguide.

Thus, a plasma was generated in the plasma processing chamber 9. At this time, the oxygen gas introduced via the plasma processing gas supply port 7 was excited, decomposed and reacted to be converted to oxygen radicals in the plasma processing chamber 9, which were then transported toward the Si substrate W to oxidize the photoresist on the substrate and exhausted to the exhaust system side to be removed. After ashing, the ashing speed and the charge density on the surface of the substrate were evaluated.

The ashing speed and uniformity obtained was as very good as 5.6 µm/min±4.5%, and the surface charge density was as sufficiently low as $-1.3×10^{11}/cm^2$.

EXAMPLE 19

Figure 17:
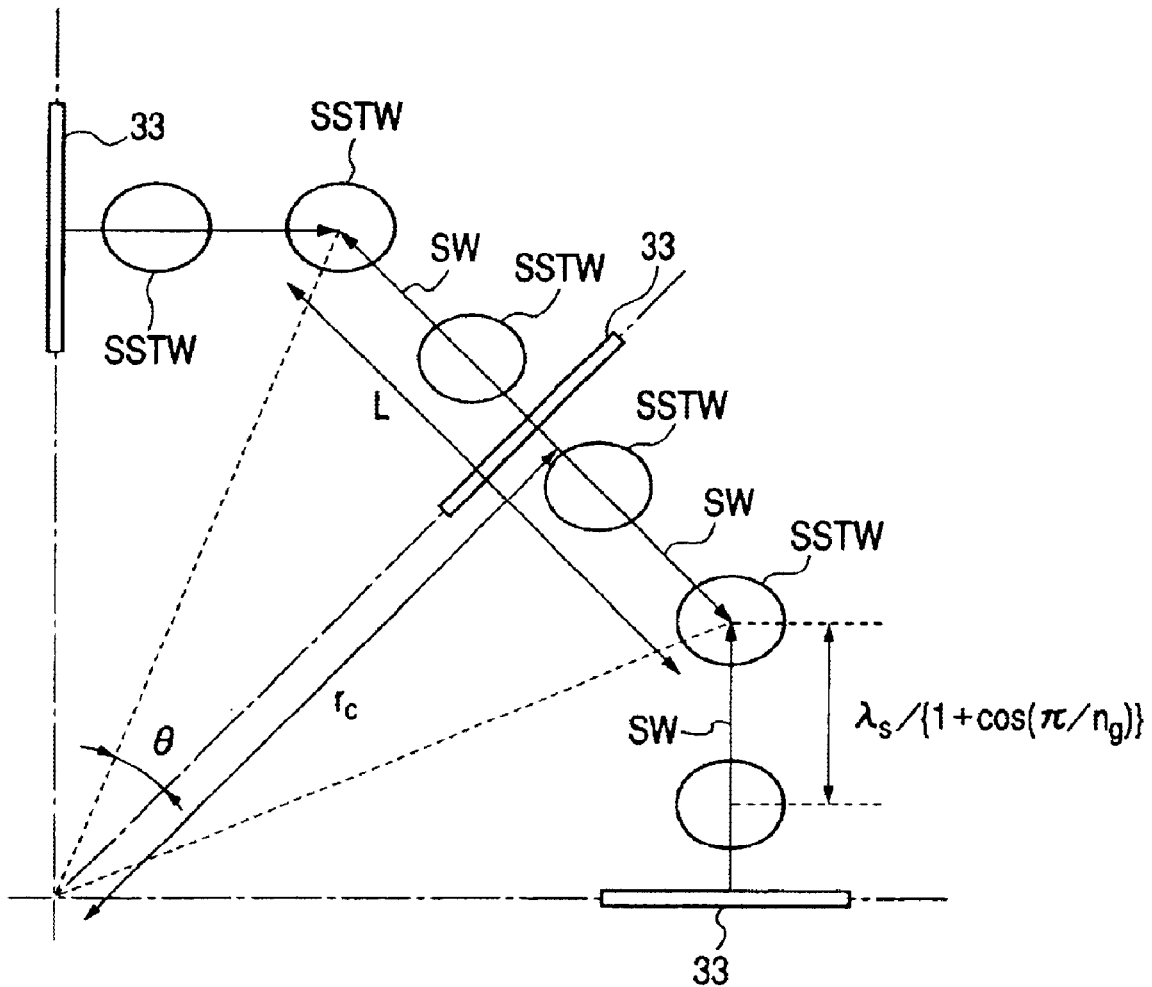
FIG. 17 is a schematic view showing a configuration of slots.

The microwave plasma processing apparatus with the microwave applicator shown in FIG. 17 was used to carry out ashing of a photoresist.

As the article W, was used a silicon (Si) substrate (φ 8 inches) immediately after an interlayer $SiO_2$ film was etched to form via holes.

First, after the Si substrate was put on the support means 2, the plasma processing chamber 9 was evacuated via the exhaust system (18, 28) to reduce the pressure down to $1.33\times10^{-3}$ Pa. Oxygen gas was introduced at a flow rate of 1 slm into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 80 Pa. A microwave power of $TE_{10}$ mode and 1.5 kW from the microwave power source MW of 2.45 GHz was supplied into the plasma processing chamber 9 through the endless circular waveguide.

Thus, a plasma was generated in the plasma processing chamber 9. At this time, the oxygen gas introduced via the plasma processing gas supply port 7 was excited, decomposed and reacted to be converted to oxygen radicals in the plasma processing chamber 9, which were then transported toward the Si substrate W to oxidize the photoresist on the substrate, thus vaporizing the photoresist to be removed. After ashing, the ashing speed and the charge density on the surface of the substrate were evaluated.

The ashing speed and uniformity obtained was very large as 5.4 $\mu$m/min±3.4%, and the surface charge density was as sufficiently low as $-1.4\times10^{11}/cm^2$.

EXAMPLE 20

The microwave plasma processing apparatus with the microwave applicator shown in FIG. 18 was used to form a silicon nitride film serving to protect a semiconductor element by the following procedure.

As the article W was used a P-type single crystal silicon substrate (face orientation <100>; resistivity: 10 $\Omega$cm) with an interlayer $SiO_2$ film on which an Al wiring pattern with line and space each of 0.5 $\mu$m was formed.

First, after the silicon substrate was put on the support means 2, the plasma processing chamber 9 was evacuated via the exhaust system (18, 28) to reduce the pressure down to $1.33\times10^{-5}$ Pa.

Subsequently, a heater as the temperature adjusting means 114 was energized to heat the silicon substrate to 300° C., and the substrate was maintained at this temperature. Nitrogen gas at a flow rate of 600 sccm and monosilane gas at a flow rate of 200 sccm were introduced into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 2.67 Pa.

Subsequently, a power of 3.0 kW from the microwave power source MW of 2.45 GHz was introduced via the endless circular waveguide.

Thus, a plasma was generated in the plasma processing chamber 9. At this time, the nitrogen gas introduced via the plasma processing gas supply port 7 was excited and decomposed in the plasma processing chamber 9 to form an active species, which was then transported toward the silicon substrate to react with the monosilane gas, thereby forming a silicon nitride film in 1.0 $\mu$m thickness on the silicon substrate.

After the film formation, the film formation speed and the film quality such as stress were evaluated. For the stress, the change in the amount of the warpage of the substrate was measured before and after the film formation using a laser interferometer Zygo (trade name).

The formation speed and uniformity of the silicon nitride film obtained was as very large as 530 nm/min±3.5%, and for the film quality, the stress was $1.2\times10^9$ dyne/cm$^2$ (compression), the leak current was $1.2\times10^{-10}$ A/cm$^2$, and the dielectric strength was 9 MV/cm, and the film was therefore confirmed to have very good quality.

EXAMPLE 21

The microwave plasma processing apparatus with the microwave applicator shown in FIG. 19 was used to form a silicon oxide film and a silicon nitride film serving as an anti-reflection film for a plastic lens by the following procedure.

As the article W, a plastic convex lens of a diameter 50 mm was used. After the lens was put on the support means 2, the inside of the plasma processing chamber 9 was evacuated via the exhaust system (18, 28) to reduce the pressure down to $1.33\times10^{-5}$ Pa. Nitrogen gas at a flow rate of 160 sccm and monosilane gas at a flow rate of 100 sccm were introduced into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 9.33 Pa.

Subsequently, a power of 3.0 kW from the microwave power source MW of 2.45 GHz was supplied into the plasma processing chamber 9 through the endless circular waveguide.

Thus, a plasma was generated in the plasma processing chamber 9. At this time, the nitrogen gas introduced via the plasma processing gas supply port 7 was excited and decomposed in the plasma processing chamber 9 to form an active species such as nitrogen atoms, which was then transported toward the lens to react with the monosilane gas, thereby forming a silicon nitride film in a 21 nm thickness on the surface of the lens.

Next, oxygen gas at a flow rate of 200 sccm and monosilane gas at a flow rate of 100 sccm were introduced into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 0.13 Pa. Subsequently, a power of 2.0 kW from the microwave power source MW of 2.45 GHz was supplied into the plasma processing chamber 9 through the endless circular waveguide.

Thus, a plasma was generated in the plasma processing chamber 9. At this time, the oxygen gas introduced via the plasma processing gas supply port 7 was excited and decomposed in the plasma processing chamber 9 to form an active species such as oxygen atoms, which was then transported toward the lens to react with the monosilane gas, thereby forming a silicon oxide film in a 86 nm thickness on the lens. After the film formation, the film formation speed and the reflection characteristic were evaluated.

The formation speeds and uniformities of the silicon nitride and silicon oxide films as obtained were as good as 330 nm/min±2.4% and 350 nm/min±2.6%, respectively, and the reflectance in the vicinity of 500 nm was 0.2%, and the film was thus confirmed to have very excellent optical characteristics.

EXAMPLE 22

The microwave plasma processing apparatus with the microwave applicator shown in FIG. 20 was used to form a silicon oxide film for interlayer insulation of a semiconductor element by the following procedure.

As the article W was used a P-type single crystal silicon substrate (face orientation <100>; resistivity: 10 Ωcm) having formed on the top portion an Al pattern of line and space of 0.5 μm each.

First, the silicon substrate was put on the substrate support 2. The plasma processing chamber 9 was then evacuated via the exhaust system (18, 28) to reduce the pressure down to $1.33 \times 10^{-5}$ Pa.

Subsequently, the heater 114 was energized to heat the silicon substrate to 300° C., and the substrate was maintained at this temperature. Oxygen gas at a flow rate of 500 sccm and monosilane gas at a flow rate of 200 sccm were introduced into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 4.0 Pa.

Subsequently, a power of 300 W was applied to the substrate support 2 with the high frequency application means 22 of 13.56 MHz, while a power of 2.0 kW from the microwave power source MW of 2.45 GHz was supplied into the plasma processing chamber 9 through the endless circular waveguide.

Thus, a plasma was generated in the plasma processing chamber 9. The oxygen gas introduced via the plasma processing gas supply port 7 was excited and decomposed in the plasma processing chamber 9 to form an active species, which was then transported toward the silicon substrate to react with the monosilane gas, thereby forming a silicon oxide film in a 0.8 μm thickness on the silicon substrate. At this time, ion species were accelerated by the RF bias to be incident to the substrate and to polish the film on the pattern, thereby improving the flatness. After the processing, the film formation speed, uniformity, dielectric strength, and step coverage were evaluated. The step coverage was evaluated by observing a cross section of the silicon oxide film formed on the Al wire pattern with a scanning electron microscope (SEM) to check presence of voids.

The formation speed and uniformity of the silicon oxide film thus obtained was as good as 250 nm/min±2.7%, and the film had a dielectric strength of 8.5 MV/cm and no voids and was confirmed to have excellent quality.

EXAMPLE 23

The microwave plasma processing apparatus with the microwave applicator shown in FIG. 20 was used to etch an interlayer $SiO_2$ film of a semiconductor element by the following procedure.

As the article W was used a P-type single crystal silicon substrate (face orientation <100>; resistivity: 10 Ωcm) having formed on an Al pattern of line and space of 0.18 μm an interlayer $SiO_2$ film in 1 μm thickness.

First, after the silicon substrate was put on the substrate support 2, the plasma processing chamber 9 was evacuated via the exhaust system (18, 28) to reduce the pressure down to $1.33 \times 10^{-5}$ Pa. $C_4F_8$ gas at a flow rate of 100 sccm was introduced into the plasma processing chamber 9 via the plasma processing gas supply port 7.

Then, the conductance valve 28 provided between the plasma processing chamber and the exhaust means 18 was adjusted to maintain the inside of the plasma processing chamber 9 at 1.33 Pa.

Subsequently, a power of 300 W was applied to the substrate support 2 with the high frequency application means 22 of 13.56 MHz, while a power of 2.0 kW from the microwave power source MW of 2.45 GHz was supplied into the plasma processing chamber 9 through the endless circular waveguide.

Thus, a plasma was generated in the plasma processing chamber 9. The $C_4F_8$ gas introduced via the plasma processing gas supply port 7 was excited and decomposed in the plasma processing chamber 9 to form an active species, which was then transported toward the silicon substrate, where ions accelerated by a self bias etched the interlayer $SiO_2$ film.

The cooler as the temperature adjusting means 114 prevented the temperature of the substrate from increasing above 80° C. After the etching, the etch rate, etch selectivity, and etched shape were evaluated. The etched shape was evaluated by using a scanning electron microscope (SEM) to observe a cross section of the etched silicon oxide film.

The etch rate and uniformity and the etch selectivity to photoresist were as good as 560 nm/min±3.2% and 15, respectively, and it was confirmed that the etched shape was almost vertical, and that the microloading effect was small.

EXAMPLE 24

The microwave plasma processing apparatus with the microwave applicator shown in FIG. 20 was used to etch a polyarylether (PAE) film as a low dielectric constant insulator for interlayer insulation of a semiconductor element by the following procedure.

As the article W was used a P-type single crystal silicon substrate (face orientation <100>; resistivity: 10 Ωcm) having on a PAE film of 0.6 μm in thickness an $SiO_2$ film hole pattern of 0.18 μm square formed in 0.3 μm thickness as a hard mask.

First, after the silicon substrate was put on the substrate support 2, and a cooler as the temperature adjusting means 114 was used to lower the substrate temperature to −10° C., the plasma processing chamber 9 was evacuated by the exhaust system (18, 28) to reduce the pressure down to $1.33 \times 10^{-5}$ Pa. $N_2$ gas at a flow rate of 200 sccm was introduced into the plasma processing chamber 9 through the processing gas supply port 7.

Then, the conductance valve 28 provided between the plasma processing chamber and the exhaust means 18 was adjusted to maintain the inside of the plasma processing chamber 9 at a pressure of 1.33 Pa.

Subsequently, a power of 300 W from a high frequency application means 22 of 1 MHz was applied to the substrate support 2, while a power of 2.0 kW from the microwave power source MW of 2.45 GHz was supplied into the plasma processing chamber 9 via the endless circular waveguide.

Thus, a plasma was generated in the plasma processing chamber 9. The $N_2$ gas introduced through the processing gas supply port 7 was excited and decomposed in the plasma processing chamber 9 to form an active species, which was then transported toward the silicon substrate, where ions accelerated by a self bias etched the PAE film.

After the etching, the etch rate, its uniformity, etch selectivity, and etched shape were evaluated. The etched shape was evaluated by using a scanning electron microscope (SEM) to observe a cross section of the etched PAE film.

The etch rate, its uniformity and the etch selectivity to $SiO_2$ were as good as 660 nm/min±3.7% and 10, respectively, and it was confirmed that the etched shape was almost vertical, and that the microloading effect was small.

According to the present invention, since the radiation characteristics of the microwaves can be controlled more accurately, the controllability of the processing in radial and circumferential directions or a direction equivalent thereto of an article can be improved.

What is claimed is:

1. A plasma processing apparatus comprising a container, a gas supply port for supplying a processing gas into the container, and a microwave applicator for supplying microwaves into the container through a dielectric window, the microwave applicator comprising an endless circular waveguide having a plurality of slots provided at a predetermined interval in a plane thereof in contact with the dielectric window, wherein the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$ is the number of antinodes of surface standing waves generated between the slots, $\lambda_s$ is the wavelength of surface waves, $n_g$ is the ratio of the circumferential length $l_g$ of the circular waveguide to the guide wavelength $\lambda_g$.

2. The plasma processing apparatus according to claim 1, wherein the value of $n_g$ is within the range of 2 to 5.

3. The plasma processing apparatus according to claim 1, wherein the angular spacing of the slots is represented by $\pi/n_g$.

4. The plasma processing apparatus according to claim 1, wherein the number $n_1$ of antinodes of surface standing waves generated between the slots is any one of 3, 5 or 7.

5. The plasma processing apparatus according to claim 1, wherein the dielectric window comprises aluminium nitride as a main component.

6. A plasma processing method comprising the steps of placing an article in a container with a microwave transmissive dielectric window; evacuating the container, introducing a processing gas into the container; and supplying microwaves into the container through an endless circular waveguide having a plurality of slots provided by perforation at a predetermined interval in a plane thereof in contact with the dielectric window and configured such that the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$ is the number of antinodes of surface standing waves generated between the slots, $\lambda_s$ is the wavelength of surface waves, $n_g$ is the ratio of the circumferential length $l_g$ of the circular waveguide to the guide wavelength $\lambda_g$, thereby generating a plasma in the container.

7. The plasma processing method according to claim 6, which effects film formation on the article by the chemical vapor deposition.

8. The plasma processing method according to claim 6, which effects etching of the article.

9. The plasma processing method according to claim 6, which effects ashing of the article.

10. The plasma processing method according to claim 6, which effects doping of the article.

11. A plasma processing apparatus comprising an internally evacuatable container and a gas supply port for supplying a processing gas into the container, for plasma processing an article arranged in the container, further comprising means for supplying a microwave energy for generating a plasma of the gas in the container, the means comprising an endless circular waveguide having a plurality of slots provided at a predetermined interval in a plane on the dielectric window side thereof, wherein the centers of the plurality of slots are offset in a direction parallel to the plane with respect to the center of the circular waveguide such that the centers of the slots are on a circle having a radius $r_c$ approximately represented by $$r_c = n_1 \lambda_s / \{2 \tan(\pi/(2n_g))\}\{1+\cos(\pi/n_g)\}$$

wherein $n_1$ is the number of antinodes of surface standing waves generated between the slots, $\lambda_s$ is the wavelength of surface waves, $n_g$ is the ratio of the circumferential length $l_g$ of the circular waveguide to the guide wavelength $\lambda_g$.

12. The plasma processing apparatus according to claim 11, wherein the value of $n_g$ is within the range of 2 to 5.

13. The plasma processing apparatus according to claim 11, wherein the angular spacing of the slots is represented by $\pi/n_g$.

14. The plasma processing apparatus according to claim 11, wherein the number $n_1$ of antinodes of surface standing waves generated between the slots is any one of 3, 5 or 7.

15. The plasma processing apparatus according to claim 11, wherein the dielectric window comprises aluminium nitride as a main component.

16. A plasma processing method of plasma processing an article, comprising using the plasma processing apparatus as set forth in claim 11 to plasma process the article.

17. The plasma processing method according to claim 16, which is at least one of ashing, etching, cleaning, CVD, plasma polymerization, doping, oxidation and nitridation.

18. The plasma processing method according to claim 16, comprising ashing a 200 mm wafer with the circumferential length of the circular waveguide being 3 times the guide wavelength of microwaves.

19. The plasma processing apparatus according to claim 11, wherein the gas supply port is provided in a side wall of the container.

20. The plasma processing apparatus according to claim 11, wherein the gas supply port is provided nearer to the plane provided with the plurality of slots than to the article.

21. The plasma processing apparatus according to claim 11, wherein the processing gas is emitted from the gas supply port to the plane provided with the plurality of slots.

22. The plasma processing apparatus according to claim 11, wherein the container is provided with an exhaust pump that reduces the pressure inside the container to $1.34 \times 10^3$ Pa or less.

23. A method of producing a structure, comprising the step of using the plasma processing apparatus as set forth in claim 11 to plasma process the article.

* * * * *

UNITED STATES PATENT AND TRADEMARK OFFICE
CERTIFICATE OF CORRECTION

PATENT NO. : 6,870,123 B2
DATED : March 22, 2005
INVENTOR(S) : Nobumasa Suzuki et al.

It is certified that error appears in the above-identified patent and that said Letters Patent is hereby corrected as shown below:

Title page,
Item [63], Related U.S. Application Data, "Continuation-in-part of application No. 09/426,744," should read -- Continuation-in-part of application No. 09/426,774, --.

Column 1,
Line 6, "Ser. No. 09/426,744" should read -- Ser. No. 09/426,774 --.

Column 5,
Line 21, "$\lambda_s$." should read -- $\lambda_s$ --.
Line 62, "$l_g$of" should read -- $l_g$ of --.

Column 10,
Line 16, "waveguide)" should read -- waveguide") --.

Column 12,
Line 54, "wherein $n_1$." should read -- wherein $n_1$ --.

Column 13,
Line 29, "ng (=$1_{g/\lambda g}$)" should read -- $n_g(=l_g/\lambda_g)$ --.

Column 14,
Line 62, "$n^1$ is 3," should read -- $n_1$ is 3, --.

Column 17,
Line 28, "ratio $n^g$" should read -- ratio $n_g$ --.
Line 29, "number $n^b$" should read -- number $n_l$ --.

Column 18,
Line 14, "length 1$_g$" should read -- length $l_g$ --.

Column 22,
Line 18, "$N_2$," should read -- $NO_2$, --.
Line 59, "$TE_{10}$. mode" should read -- $TE_{10}$ mode --.

UNITED STATES PATENT AND TRADEMARK OFFICE
CERTIFICATE OF CORRECTION

PATENT NO.    : 6,870,123 B2
DATED         : March 22, 2005
INVENTOR(S)   : Nobumasa Suzuki et al.

It is certified that error appears in the above-identified patent and that said Letters Patent is hereby corrected as shown below:

Column 35,
Line 19, "wherein n," should read -- wherein $n_1$ --.
Line 36, "container," should read -- container; --.

Signed and Sealed this

Fourteenth Day of February, 2006

JON W. DUDAS
*Director of the United States Patent and Trademark Office*